United States Patent [19]
Anmo

[11] Patent Number: 5,665,615
[45] Date of Patent: Sep. 9, 1997

[54] METHOD OF MAKING BICMOS SEMICONDUCTOR DEVICE

[75] Inventor: Hiroaki Anmo, Kanagawa, Japan

[73] Assignee: Sony Corporation, Tokyo, Japan

[21] Appl. No.: 600,539

[22] Filed: Feb. 13, 1996

[30] Foreign Application Priority Data

Feb. 14, 1995 [JP] Japan ................. 7-025219

[51] Int. Cl.⁶ ........................................ H01L 21/265
[52] U.S. Cl. ........................ 438/202; 257/370; 438/234
[58] Field of Search ........................ 437/31, 44, 59, 437/186, 187, 191, 193, 195; 148/DIG. 9; 257/273, 378, 370

[56] References Cited

U.S. PATENT DOCUMENTS

| | | | |
|---|---|---|---|
| 4,927,776 | 5/1990 | Soejima | 437/33 |
| 4,960,726 | 10/1990 | Lechaton et al. | 437/59 |
| 4,965,220 | 10/1990 | Iwasaki | 437/59 |
| 5,059,549 | 10/1991 | Furuhata | 437/59 |
| 5,196,356 | 3/1993 | Won et al. | 437/59 |
| 5,409,845 | 4/1995 | Robinson et al. | 437/31 |
| 5,439,833 | 8/1995 | Hebert et al. | 437/31 |

Primary Examiner—John Niebling
Assistant Examiner—Long Pham
Attorney, Agent, or Firm—Hill, Steadman & Simpson

[57] ABSTRACT

A BiCMOS semiconductor device comprising a substrate, a vertical bipolar transistor provided on the substrate and having a first conductive base terminal electrode formed in a portion of a first semiconductor film provided on the substrate, a second conductive semiconductor terminal electrode formed in a second semiconductor film provided through an insulating layer on the first semiconductor film, the first and second conductive electrodes being disposed such that portions thereof overlap each other, and an LDD (lightly doped drain)-type MOS transistor provided on the substrate and having a gate electrode formed in a portion of said first semiconductor film and a gate side wall formed on a side wall of said gate electrode, wherein the insulating layer is caused to exist selectively in a region in which the first and second conductive electrodes are overlapped, and constitutes at least a portion of the gate side wall.

6 Claims, 21 Drawing Sheets

METHOD OF MAKING BICMOS SEMICONDUCTOR DEVICE

BACKGROUND OF THE INVENTION

1. Field of the Invention

This invention relates to a highly reliable semiconductor device having a vertical bipolar transistor and LDD (Lightly Doped Drain) type MOS transistor installed on the same substrate and to a method for manufacturing the device at a low cost.

2. Description of the Prior Art

As a design rule for a semiconductor device is reduced and the number of transistors integrated in one chip is increased, it is required that a chip area is further increased. With such a tendency, it becomes necessary to arrange wirings, to which many loads are connected on the chip or to arrange a long wiring with a large capacitance. In order to drive such high capacitance loads as above at a high speed, it is preferable to apply a bi-polar transistor having a superior current driving capability as compared with that of MOS transistor and having a high trans-conductance. In turn, in view of its high integration and a low power consumption, it is preferential to apply a CMOS transistor circuit. Thus, in the recent semiconductor devices such as VLSI and ULSI, a large number of bi-CMOS transistor circuits (hereinafter referred to as "BiCMOS") capable of combining a bi-polar transistor with the CMOS transistor circuit to get merits from both transistors have been employed. These devices having much performances are utilized in TV equipment, video equipment, portable telephone equipment or a hard disk device or a high-speed memory element.

As for the semiconductor device such as a BiCMOS having a complex structure, it becomes more important to get a high performance and to reduce its number of manufacturing steps and its manufacturing cost in view of promoting its practical application or distribution.

In this case, the manufacturing steps for the general BiCMOS of the prior art will be described. The bi-polar transistor contained in BiCMOS explained here is a vertical bipolar transistor in which either npn-junction or pnp-junction corresponding to emitter/base/collector is formed in a depth direction (a vertical direction) of the substrate. Typically, the bi-polar transistor has been manufactured by a process in which a base terminal is formed in a first semiconductor film and an emitter terminal is formed by a second semiconductor film. Since either a poly-silicon film or polycide film containing impurities is normally used as these first and second semiconductor films, a constitution of such a bi-polar transistor is sometimes called "a double polysilicon constitution". The aforesaid emitter terminal is contacted with the substrate in a self-aligned manner within a window (emitter window) opened at the aforesaid base terminal, so that both terminals are insulated from each other by an insulating film covering the base terminal and an emitter side wall formed at the side wall surface of the aforesaid emitter window.

A typical manufacturing process is illustrated in FIGS. 1 to 5, in which PMOS transistor is eliminated for a sake of clarity and only NPN bi-polar transistor (NPN-Tr) and NMOS transistor are illustrated. Accordingly, description about the forming process of PMOS transistor is omitted here.

At first, an $n^+$ type embedded collector region 2 ($n^+$-BL) is formed at a surface insulator of a p-type silicon substrate 1 (p-Sub). Subsequently an n-type epitaxial insulator 3 (n-Epi) is grown at its entire surface. Then, an element separating field oxide film 4 is formed in accordance with a well-known LOCOS process. An ion-implantation is carried out through this field oxide film 4 and a resist mask (not shown), whereby a p-type well 5 (p-Well) is formed. Further a p type channel stop region 6 is formed within the substrate below the field oxide film 4 by a high energy ion-implantation process. After this operation, annealing is carried out to connect the p-type well 5 and the channel stop region 6 to the silicon substrate 1.

Then, a gate oxide film 7 is formed in an active region of the silicon substrate by a thermal oxidizing process, subsequently the gate oxide film 7 is selectively removed from the base forming region of NPN-Tr so as to form a base window 7BW. Then, the first polysilicon film is deposited on an entire surface of the substrate, and, boron ($BF_2^+$) is introduced into a region acting as a base electrode and phosphorusus ($P^+$) is embedded into a region acting as a gate electrode of NMOS by an ion-implantation process using a photo-resist (not shown). Further, the first insulator polysilicon film is processed with a patterning, the base electrode 8B is formed at the NPN-Tr part and the gate electrode 8G is formed at the NMOS part concurrently. In addition, phosphorusus ($P^+$) with low ion concentration is introduced into the active region of the NMOS part by using an ion-implantation method so as to form an $n^-$ type LDD region. This LDD region may constitute a part adjacent to the channel end of a source/drain region 16SD at the later stage, which serves for reducing a high electrical field near the drain end to improve a hot-carrier resisting property of the MOS transistor.

Then, an insulating film is deposited on the entire surface of the substrate, and the film is entirely etched-back to form a gate side wall 100G on the side wall surface of the aforesaid gate electrode 8G. At this time, a side wall 100 is also formed on the side wall surface of the base electrode 8B. In addition, under this condition, arsenic ($As^+$) with low ion concentration is introduced into the active region so as to form a source/drain region 16SD of the LDD type NMOS and the collector region 16C of NPN-Tr. FIG. 1 indicates the semiconductor devices subjected to the processes described above.

Then, a SiOx interlevel insulator film layer 101 is deposited on an entire surface of the substrate, and this SiOx interlevel insulator film layer 101 and a base electrode 8B are totally processed with patterning in an emitter-forming region at the NPN-TF part so as to open the emitter window 8EW. Boron ($BF_2^+$) is introduced through this emitter window 8EW by ion-implantation method so as to form a p-type intrinsic base region 11. FIG. 2 is illustrates the semiconductor devices subjected to the processes described above.

Then, after the insulating film is deposited on an entire surface of the substrate, a heat treatment is carried out so as to activate the impurities already fed into the active region and concurrently boron is dispersed from the base leading electrode 8B into the activated region so as to form a $p^-$ type graft base region 13. Subsequently, the aforesaid insulating film is etch backed at its entire surface so as to form an emitter side wall 12 on the inner surface of the emitter window 8EW. This emitter side wall 12 may act to insulate the base leading electrode 8B against the emitter leading electrode 14E to be described later. Subsequently, a second surface poly-silicon film is deposited on an entire surface of the substrate, arsenic ($As^+$) becoming emitter impurities is fed in its ion form to this film, thereafter this arsenic is dispersed into the real base region 11 by heat treatment so as to form an emitter region 17. After this operation, the second insulator polysilicon film is etched in anisotropy state through a resist mask (not shown) and an emitter leading electrode 14E is formed. In FIG. 2 illustrates a completed state of processing performed up to now.

Then, as shown in FIG. 4, an SiOx interlevel insulator film layer 102 is deposited on an entire surface of the substrate. In addition, as shown in FIG. 5, this SiOx interlevel insulator film layer 102 is dry etched in the region adjacent to the emitter leading electrode 14E, and both SiOx interlevel insulator film layer 102 and 101 are dry etched in the region adjacent to each of the base leading electrode 8B, the collector leading region 16C, and the source/drain region 16SD through a resist mask not shown so as to open a connection hole 103. In addition, a well-known wiring material film is formed on the entire surface of the substrate, the film is processed in patterning to form a base leading electrode 104B, an emitter electrode 104E and a collector electrode 104C at the NPN-Tr part and to form source/drain electrodes 104SD at the NMOS part, respectively.

OBJECT AND SUMMARY OF THE INVENTION

In the aforesaid BiCMOS manufacturing process, two steps of an entire deposition of the insulating film and an etching-back are carried out in order to form exclusively the gate side wall 100G, although these steps are desired to be reduced while they may also act as a certain step.

Additionally, as apparent from FIG. 5, when the connecting hole 103 is formed, two, insulators of SiOx interlevel insulator film layer 102, 101 are totally processed in patterning at each of the regions adjacent to each of the base leading electrode 8B, the collector leading region 16C, and the source/drain regions 16SD, resulting in that this total patterning may become a cause for increasing an aspect ratio of the connecting hole 103. For example, if it is assumed that a film thickness of the SiOx interlevel insulator film layer 101 is set to be 350 nm, a film thickness of the SiOx interlevel insulator film layer 102 is set to be 400 nm, an opening diameter of the connecting hole 103 is set to 0.8 μm (=800 nm), an aspect ratio of the connecting hole 103 at the emitter contact part where only the insulating film 102 is opened is 0.5 and in turn an aspect ratio at the contact part for the substrate and at the contact part for the base leading electrode 8B is increased up to 0.94. It is generally said that the connecting hole may cause a trouble in an embedding of an upper insulator wiring with a sputtering when its aspect ratio exceeds 0.5, and it may easily produce a poor contact or a broken wire (a so-called step cutting) at the step part of an opening end. As for the connecting hole having a high aspect ratio, a metal embedding with a blanket tungsten process, for example, is also effective, although there are certain problems that WF6 of CVD raw material gas is expensive, an additional etch-back process is required and a high level technology is needed for judging a final point of this etch back. These problems may become a cause of increasing cost of a semiconductor device. In addition, in the case that a plurality of connecting holes 103 having substantial different aspect ratios as described above are tried to be opened at the same stage, a quite superior over-etching resistance is required in the emitter leading electrode 14E.

As, described above, the prior art BiCMOS and its manufacturing method were not necessarily sufficient in view of cost and accuracy as well. In view of this fact, it is an object of the present invention to provide a semiconductor device including a highly reliable BiCMOS and a method for performing a high accurate manufacturing of a semiconductor device while reducing the number of manufacturing steps for the semiconductor device or restricting its increasing in number to a minimum limited value.

The semiconductor device of the present invention is proposed in order to attain the aforesaid object, contains a so-called BiCMOS in which a vertical bipolar transistor having a first conductive base leading electrode formed by using a first insulator semiconductor film formed on a substrate and having a second conductive emitter leading electrode formed to be partially overlapped on the base leading electrode by using the second insulator semiconductor film deposited on the first insulator semiconductor film through an insulating film, and an LDD type MOS transistor having a gate side wall on a side wall surface of the gate electrode formed by using the first insulator semiconductor film are formed on the same substrate, wherein the insulating film is selectively left within an overlapping region between the base leading electrode and the emitter leading electrode and constitutes at least a part of the gate side wall.

In order to manufacture such a semiconductor device as described above, the manufacturing method is comprised of a first step for patterning the first insulator semiconductor film on the substrate and forming a first conductive base leading electrode of the vertical bipolar transistor and a gate electrode of an LDD type MOS transistor; a second step for forming an LDD region of the LDD type MOS transistor by feeding low concentration of ion into the substrate with the gate electrode being applied as a mask; a third step for covering an entire surface of the substrate with an insulating film; a fourth step for totally patterning the insulating film and the base leading electrode and opening an emitter window so as to expose the substrate; a fifth step for forming an insulating emitter side wall on an inner wall surface of the emitter window; a sixth step for depositing a second insulator semiconductor film on an entire surface of the substrate; a seventh step for patterning the second insulator semiconductor film and forming a second conductive type emitter leading electrode; an eighth step for etching back the insulating film with the emitter leading electrode being applied as a mask, exposing at least an upper surface of the gate electrode, a part of the base leading electrode and an active region of the substrate and forming a gate side wall on a side wall surface of the gate electrode; and a ninth step for feeding ion of high concentration into the substrate with the gate electrode and the gate side wall being applied as a mask and forming a source/drain region of the LDD type MOS transistor. In addition, in the case that the insulating film is etch backed which is a major feature of this process, the emitter leading electrode may be used as a mask in a single form, although it is also preferable that the resist mask formed for a patterning operation of the emitter leading electrode is left and both resist mask and the emitter leading electrode may be used as a mask.

In this case, when the ion of high concentration is fed in the ninth step, it is possible to perform concurrently a formation of the collector leading region of the vertical type bipolar transistor.

The semiconductor device of the present invention may be constructed such that a high melting metallic silicide insulator may be formed at each of the surfaces of a npn-presence region of the insulating film on the base leading electrode, the emitter leading electrode, the gate electrode, a collector leading region of the bipolar transistor and source drain regions of the LDD type MOS transistor. As the high melting metal applied in this case, it is possible to apply tungsten (W), molybdenum (Mo), titanium (Ti), zirconium (Zr), hafnium (Hf), cobalt (Co), nickel (Ni) and platinum (Pt), for example.

Such a semiconductor device as above can be manufactured by a so-called SALICIDE (a self-aligning silicide formation) process in the case that a silicon substrate is used as the substrate and silicon thin film containing impurities is used as the first insulator semiconductor film and the second insulator semiconductor film. That is, it is satisfactory that upon completion of the aforesaid eighth step, the entire surface of the substrate is covered by a metallic thin film of high melting point and heat treated to cause a surface insulator of each of the gate electrode, a part of the base leading electrode, the emitter leading electrode and an active region of the substrate to be changed into a metallic silicide insulator of high melting point in a self-aligning manner.

In the present invention, it is satisfactory that the gate side wall is of a double insulator structure composed of an inner gate side wall contacted with a side wall surface of the gate electrode and an outer gate side wall covering the surface of the inner gate side wall in order to shorten the length of the LDD region of the LDD type MOS transistor and improve its operating speed, and further the insulating film may be provided with the outer gate side wall.

In order to manufacture such a semiconductor device as described above, ion of high concentration is fed after the inner gate side wall is formed and a MOS transistor part is completed in advance to the bipolar transistor part. That is, the manufacturing process is performed through a first step for patterning a first insulator semiconductor film on a substrate so as to form a first conductive type base leading electrode of a vertical bipolar transistor and a gate electrode of the LDD type MOS transistor; a second step for feeding ion of low concentration to the substrate with the gate electrode being applied as a mask so as to form an LDD region of the LDD type MOS transistor; a third step for covering the entire surface of the substrate with the first insulating film; a fourth step for etch backing the first insulating film so as to form an inner gate side wall on the side wall surface of the gate electrode; a fifth step for feeding ion of high concentration to the substrate with the gate electrode and the inner gate side wall being applied as masks so as to form source/drain regions of the LDD type MOS transistor; a sixth step for covering the entire surface of the substrate with the second insulating film; a seventh step for totally patterning the second insulating film and the base leading electrode and opening an emitter window so as to expose the substrate; an eighth step for forming an insulating emitter side wall on an inner wall surface of the emitter window; a ninth step for depositing the second insulator semiconductor film on the entire surface of the substrate; a tenth step for patterning the second insulator semiconductor film so as to form a second conductive type emitter leading electrode; and an eleventh step for etching back the second insulating film with the emitter leading electrode being applied as a mask, exposing at least the upper surface of the gate electrode, a part of the base leading electrode and an active region of the substrate, and forming the outer gate side wall on the side wall surface of the inner gate side wall.

Also in this case, it is possible to perform a concurrent formation of the collector leading region of the vertical bipolar transistor through feeding of ion of high concentration in the fifth step. In addition, upon completion of the first step, if the entire surface of the substrate is covered by the metallic thin film of high melting point to perform a heat treatment on it, a surface part of each of the gate electrode, a part of the base leading electrode, the emitter leading electrode and the active region in the substrate can be changed into the metallic silicide insulator of high melting point in a self-alignment manner.

According to the present invention, since the gate side wall of the LDD type MOS transistor is concurrently formed with an insulating film contributed to an insulation between the base leading electrode and the emitter leading electrode of the vertical bipolar transistor, it is possible to reduce the number of steps as compared with that of the manufacturing process for the prior art BiCMOS in which the forming of the gate side wall is carried out in an independent step. Since this formation of the gate side wall is carried out by an anisotropic etching back operation of the insulating film, the active region of the substrate or a part of the base leading electrode is exposed upon completion of this etching-back operation. Accordingly, contacting of an upper insulator wiping for the source/drain regions or the collector region to be formed in the active region at the latter step, or contacting for the base leading electrode is carried out through a connecting hole having a relative low aspect ratio passing only through the insulating film newly formed after the contacting operation, resulting in that it is possible to prevent a cutting of line or a poor contact. In addition, in the present invention, since the upper surface of the base leading electrode is once exposed by this etching-back process, it becomes possible to perform a self-aligned silicide formation at the surface of the base leading electrode which could not be performed in the conventional process and also the base resistance can be reduced.

In the case that the formation of the gate side wall is carried out in two separate times in the present invention, the number of steps in the present invention is not different from that of the conventional process described above, although it is possible to improve a performance at the MOS transistor part. To the contrary, if a similar operation is tried to be carried out under an extended mode of the conventional process, a deposition at the entire surface of the insulating film and its etching-back operation become necessary as independent steps for the formation of the inner gate side wall, so that improvement of performance at the MOS transistor part necessarily accompanies with an increased number of steps, resulting in that this process is disadvantageous in view of its cost.

DETAILED DESCRIPTION OF THE PREFERRED EMBODIMENTS

Figure 1:
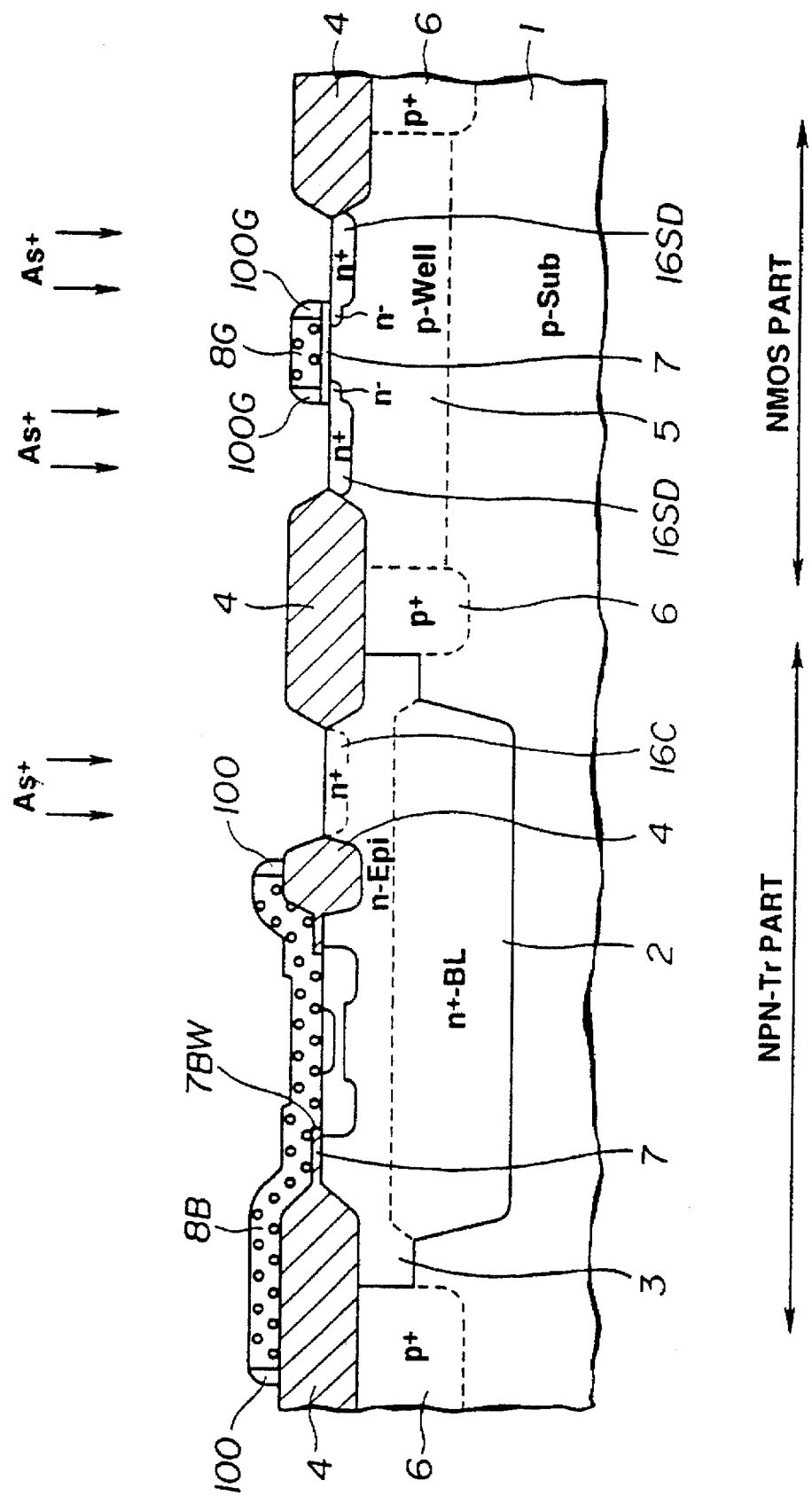
FIG. 1 is a schematic sectional view for showing a state in the conventional manufacturing process for BiCMOS in which formation of a collector embedding region on a Si substrate, formation of an n-type epitaxial insulator, separation of element, formation of a well, formation of a gate oxide film, opening of a base window, formation of a base leading electrode and a base electrode through a full surface deposition of a first insulator polysilicon-patterning, formation of an LDD region through feeding of ion of low concentration, formation of a gate side wall through a full surface deposition of SiOx film and etching-back, and formation of a collector leading region and source/drain region through feeding of ion of high concentration are carried out.
Figure 2:
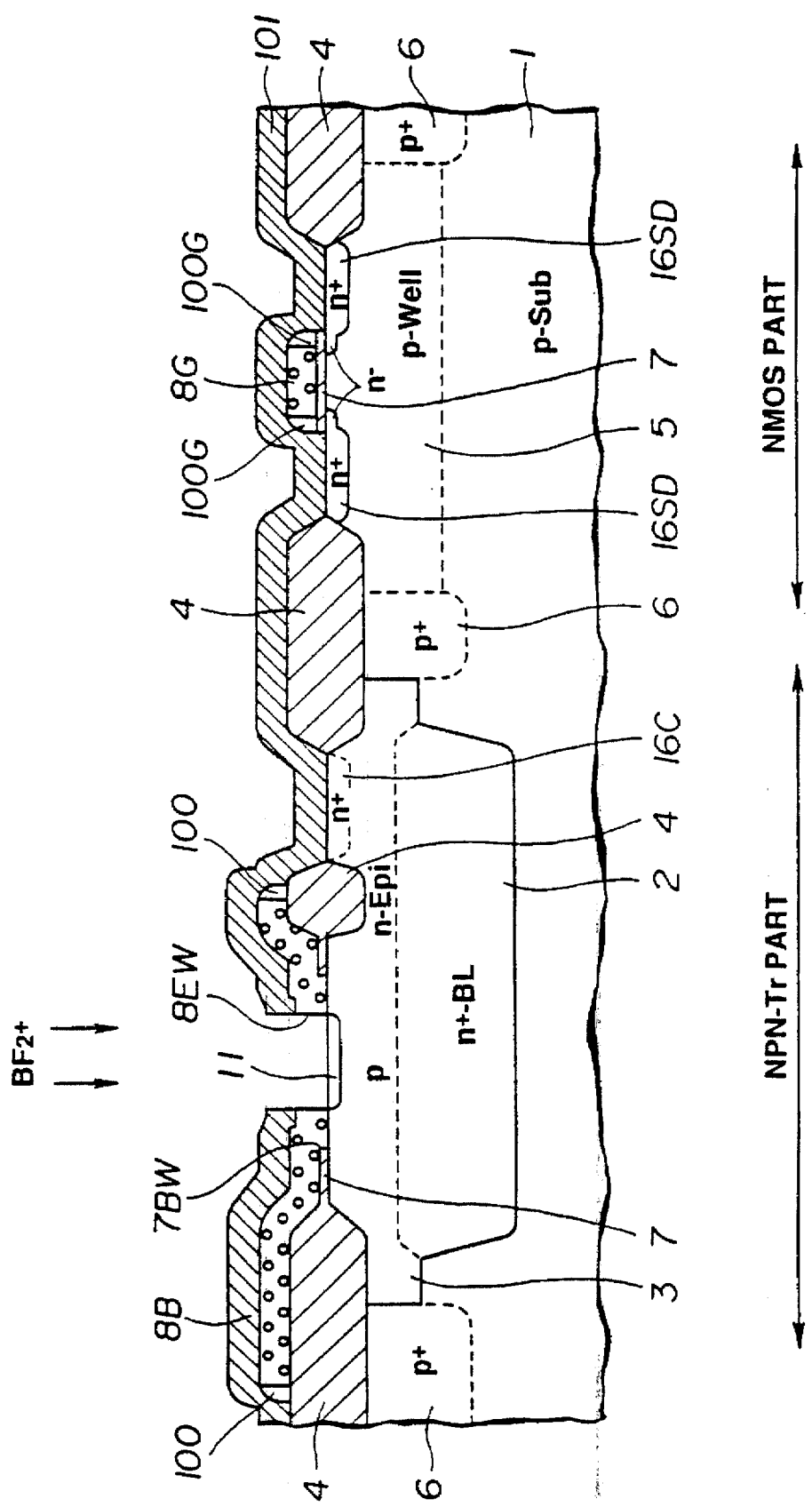
FIG. 2 is a schematic sectional view for showing a state in which a full surface deposition of a SiOx, opening of an emitter window, and formation of a real base region are carried out.
Figure 3:
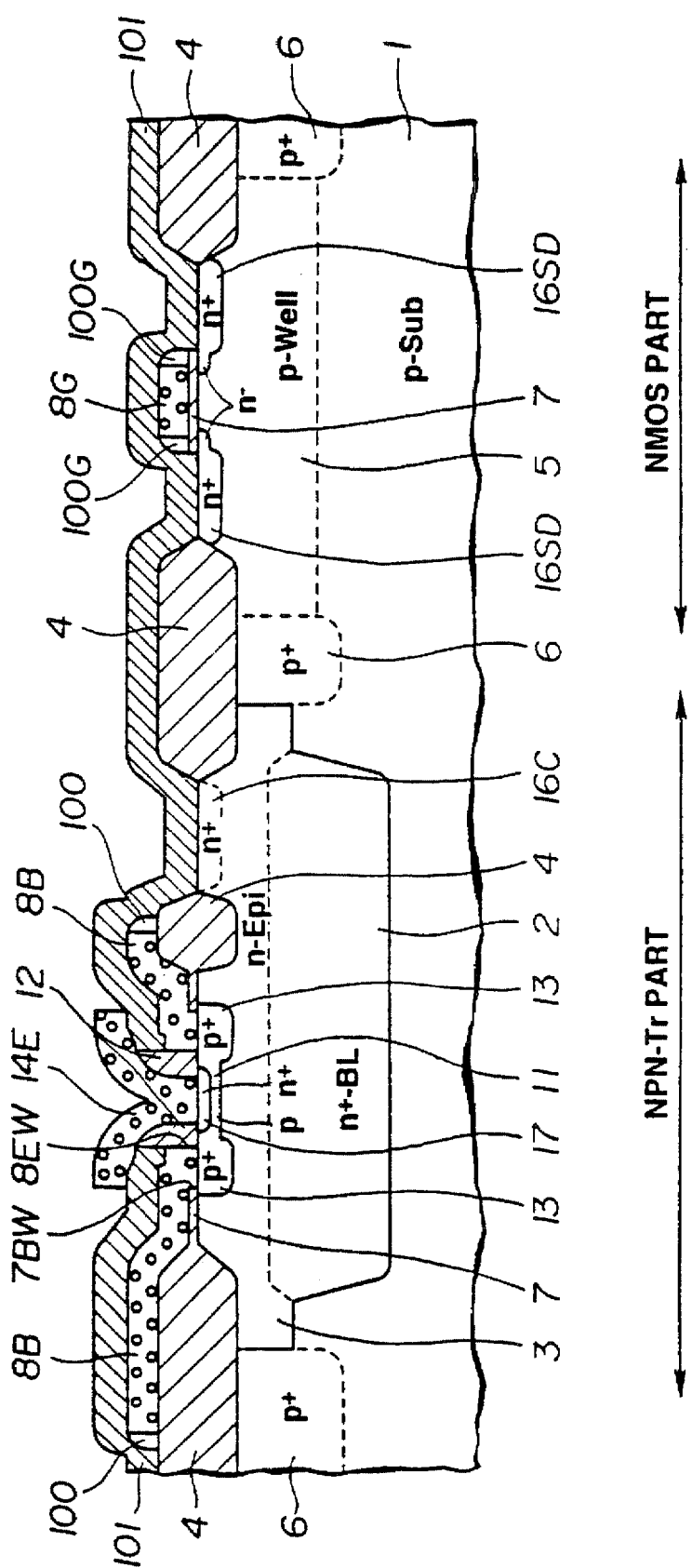
FIG. 3 is a schematic sectional view for showing a state in which a full surface deposition of SiOx film, formation of a graft base region through a dispersion annealing, formation of an emitter side wall through an emitter etching-back of a SiOx film, a full surface deposition of a second insulator polysilicon film, and formation of an emitter leading electrode through a patterning of a second insulator polysilicon film are carried out.
Figure 4:
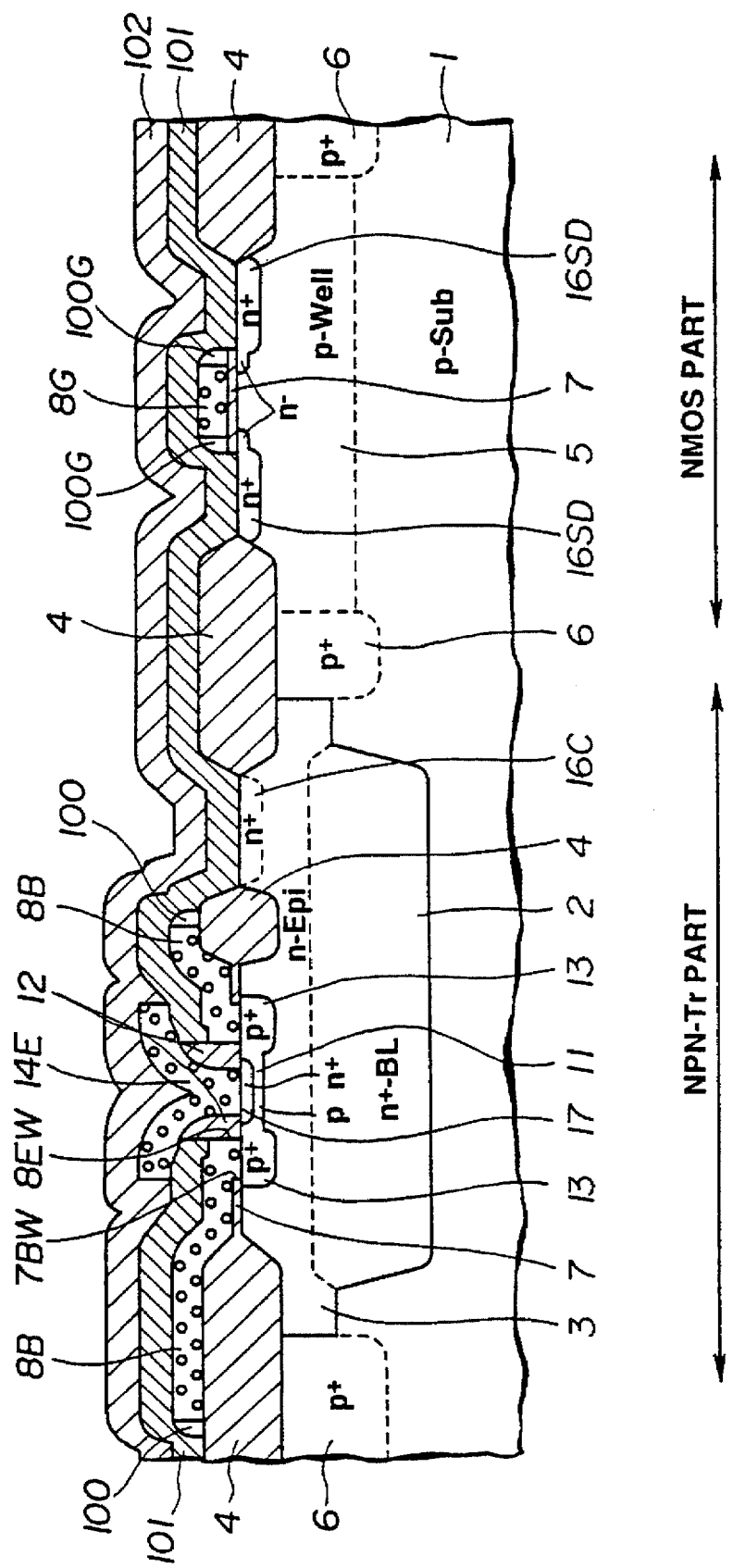
FIG. 4 is a schematic sectional view for showing a state in which a full surface deposition of a SiOx interlevel insulator film layer and a feeding of emitter impurities are carried out.

Practical preferred embodiments of the present invention will be described as follows.

EXAMPLE 1

In this embodiment, a method for manufacturing BiCMOS in which an insulating film just below an emitter leading electrode of a vertical NPN-Tr and a gate side wall of an LDD type NMOS are concurrently formed and advantages of BiCMOS obtained by this method will be described.

At first, referring to FIGS. 6 to 13, the manufacturing method will be described. Provided that since all the drawings referenced in the specification illustrate only NMOS part in a CMOS transistor circuit for a sake of sheet, description about PMOS part and its forming process will be roughly explained.

At first, antimony (Sb) was dispersed in its solid phase about 1200° C. by using an oxidizing mask (not shown) in a NPN-Tr forming region of p type <100> Si substrate 1 (p-Sub) so as to form an $n^+$ type embedded collector region 2. A sheet resistance ρs at this time was 20 to 40Ω/□, for example, and a junction depth $x_j$ was 1 to 2 μm.

Then, an n-type epitaxial insulator 3 (n-Epi) was grown on an entire surface of the substrate. A resistibility of this n-type epitaxial insulator 3 was 5 Ωcm and its thickness was 1.0 μm. At this time, the aforesaid embedded collector region 2 ($n^+$-BL) was dispersed upwardly by about 0.2 μm.

Then, the substrate was oxidized by a LOCOS process so as to form a field oxide film 4. In this LOCOS process, at first, a pad oxide film having a thickness of 50 to 100 nm was formed at the entire-surface of the substrate by a thermal oxidation process according to the normal method and further a Si3N4 film with a thickness of about 50 to 100 nm was formed by a reduced pressure CVD. Then, the Si3N4 film and the pad oxide film were etched in sequence through a resist mask so as to form a selective oxidizing mask. At this state, pyrogenic oxidization was carried out at 950° C. for 120 minutes so as to form a field oxide film 4 having a thickness of about 400 nm. Then, the $Si_3N_4$ film was removed, a resist mask was formed on the substrate while the pad oxide film was left, and a p-type well 5 acting as an NMOS forming region was formed by ion injection of boron ($B^+$). An ion injection condition at this time was set to have an ion acceleration energy Of 360 keV and a dose of $1\times10^{13}/cm^2$. Subsequently, another resist mask was formed and a $p^+$ type channel stop region 6 was formed just below the field oxide film 4 by ion injection of boron ($B^+$). The ion injecting condition at this time was set to have an ion acceleration energy of 550 keV and a dose of $5\times10^{13}/cm^2$. After this operation, impurities were activated by annealing at 950° C. for about 60 minutes within atmosphere of $N_2$ and the p-type well 5 and the channel stop region 6 were connected to the p-type Si substrate.

Then, the aforesaid pad oxide film was removed, subsequently pyrogenic oxidizing was carried out at 950° C. for example and for about 18 minutes and a gate oxide film 7 having a thickness of about 20 nm was formed at the surface of the active region in the substrate. After this operation, the oxide film was processed with patterning at the base forming region at the NPN-Tr part and the base window 7BW was opened.

Figure 6:
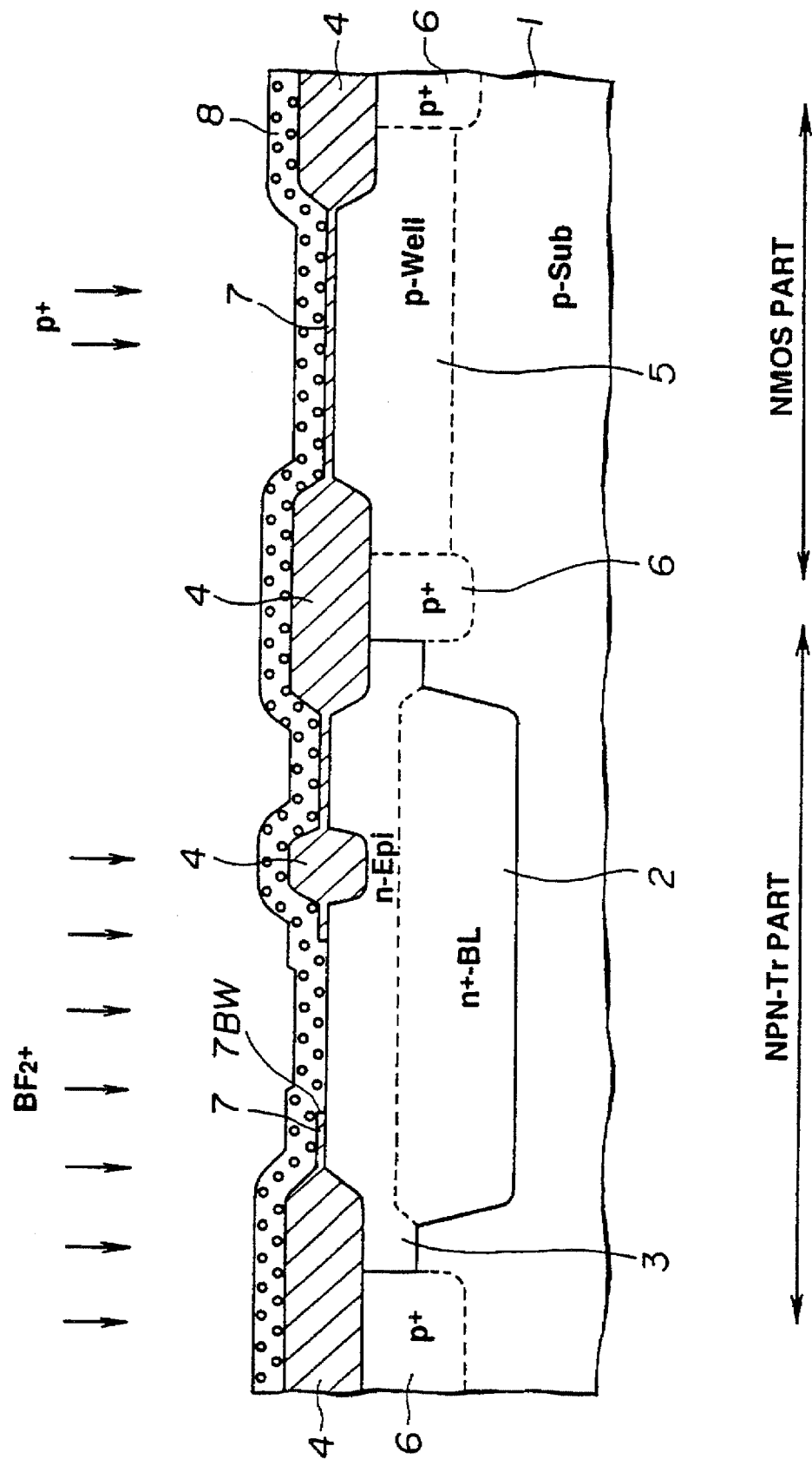
FIG. 6 is a schematic sectional view for showing a state in which a first insulator polysilicon film is formed at the entire surface on a Si substrate through formation of a collector embedded region, formation of an n-type epitaxial insulator, separation of element, well formation, formation of a gate oxide film and opening of a base window in a manufacturing process for BiCMOS to which the present invention is applied.

In addition, a pressure reduced CVD was carried out at about 650° C. and a first insulator polysilicon film 8 having a thickness of about 150 nm was formed on the entire surface of the substrate. Boron ($BF_2^+$) was ion injected into the region of the first insulator polysilicon film 8 acting as a base leading electrode 8B (refer to FIG. 7) after the operation, and phosphorusus ($P^+$) was selectively ion injected into the region acting as a gate electrode 8G (refer to FIG. 7) after the operation, respectively, The ion injecting condition at this time was set to have an ion accelerating energy of 10 to 30 keV and a dose of $3\times10^{15}/cm^2$, for example. In FIG. 6 are illustrated the steps performed up to now. In addition, in the case that the aforesaid ion injection is carried out, phosphoruse can be fed similarly against the gate electrode forming region in PMOS part not shown, although in recent years, it has been also carried out to change a work function of the gate electrode so as to control a threshold voltage $V_{th}$, so it is applicable that boron may be fed into the PMOS part through a resist mask.

Figure 7:
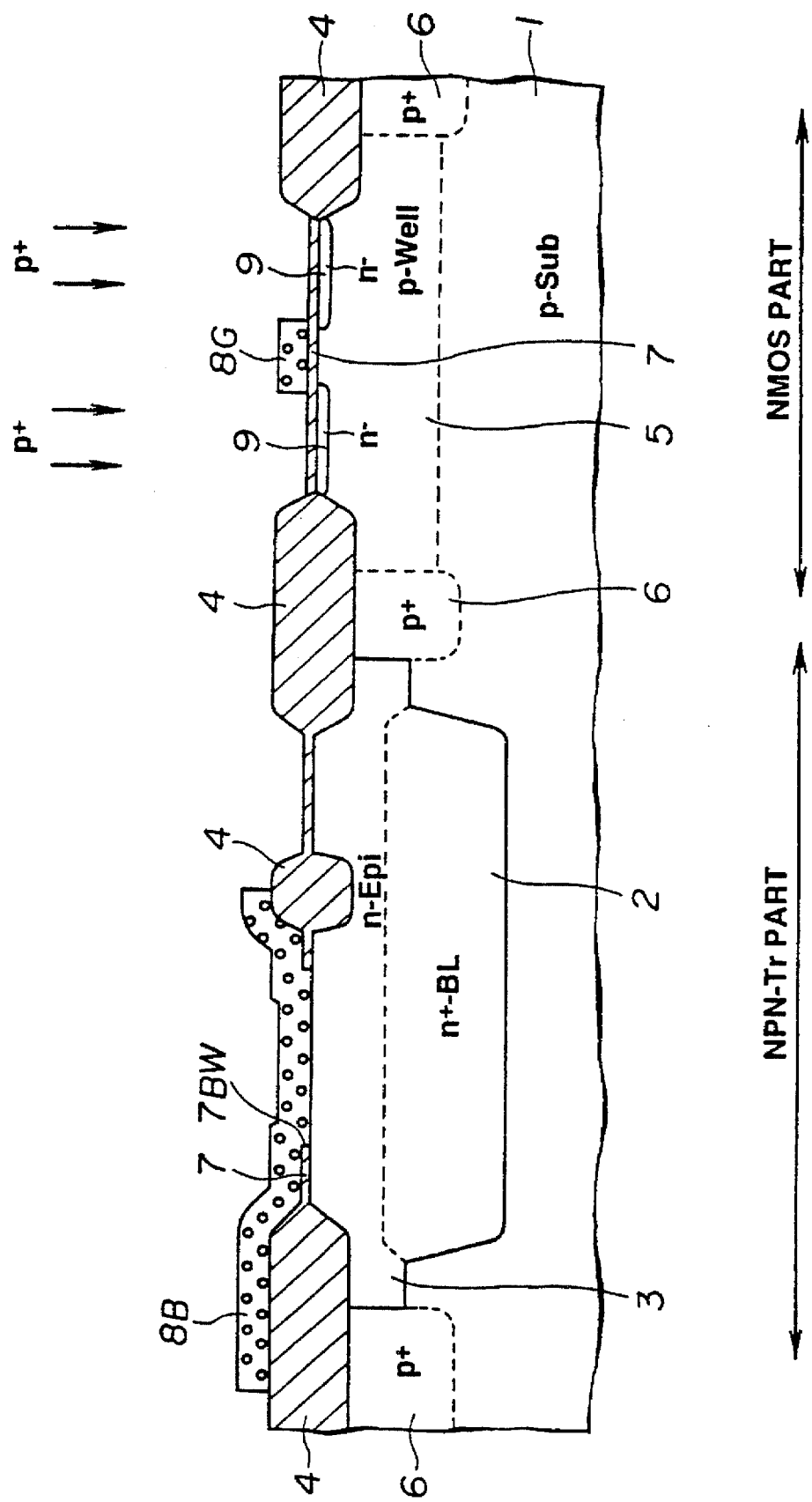
FIG. 7 is a schematic sectional view for showing a state in which a base leading electrode and a gate electrode are formed through patterning of the first insulator polysilicon film and an LDD region is formed through feeding of ion of low concentration.

Then, as shown in FIG. 7, the aforesaid first insulator polysilicon film 8 was processed with patterning to perform a concurrent formation of the base leading electrode 8B and the gate electrode 8G. This patterning was performed by a dry etching, for example, using mixture gas of $SF_6/C_2Cl_3F_3$ through a resist mask not shown. An $n^-$ type LDD region 9 was formed in a self-alignment manner by ion injecting of low concentration of phosphorusus ($P^+$) into NMOS part with the aforesaid gate electrode 8G being applied as a mask. The ion injecting condition at this time was set to have an ion accelerating energy of 25 keV and a dose of $5\times10^{13}/cm^2$. As for the PMOS part not shown boron ($BF_2^+$) was ion injected to form $p^+$-type LDD region.

Figure 8:
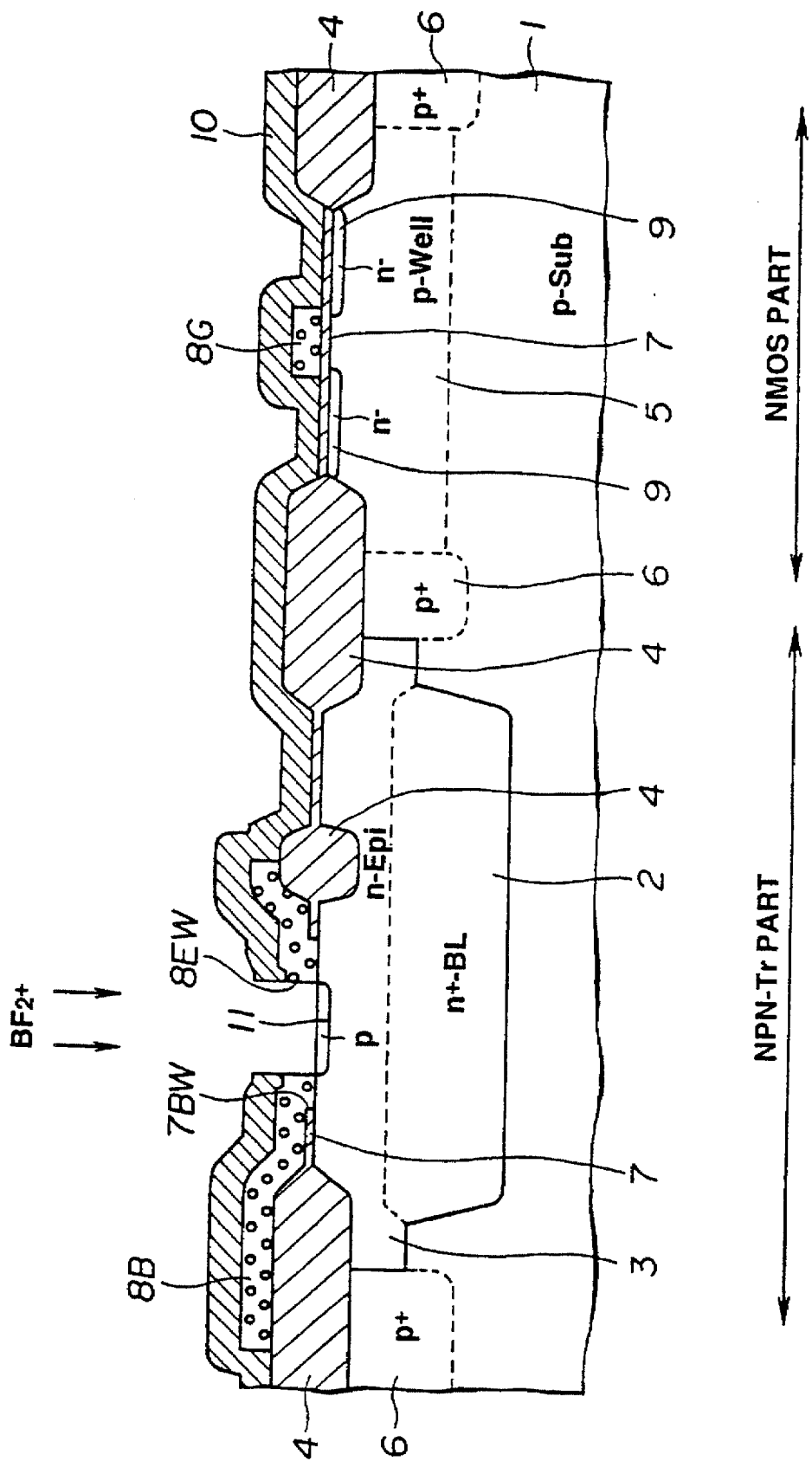
FIG. 8 is a schematic sectional view for showing a state in which a full surface deposition of a SiOx film, opening of an emitter window and an ion feeding for use in forming a real base region are carried out.

Then, a SiOx film 10 acting as an insulating film with a thickness of about 300 nm was formed at the entire surface of the substrate as shown in FIG. 8 by performing the pressure reduced CVD at about 400° C. Subsequently, the aforesaid SiOx film 10 and the base leading electrode 8B were dry-etched in sequence through a resist mask not shown and the emitter window 8EW was opened. In addition, $BF_2^+$ was ion injected through this emitter window 8EW to form p-type real base region 11. The ion injecting condition at this time was set to have an ion accelerating energy of 30 to 100 keV and a dose of $1\times10^{13-14}/cm^2$.

Figure 9:
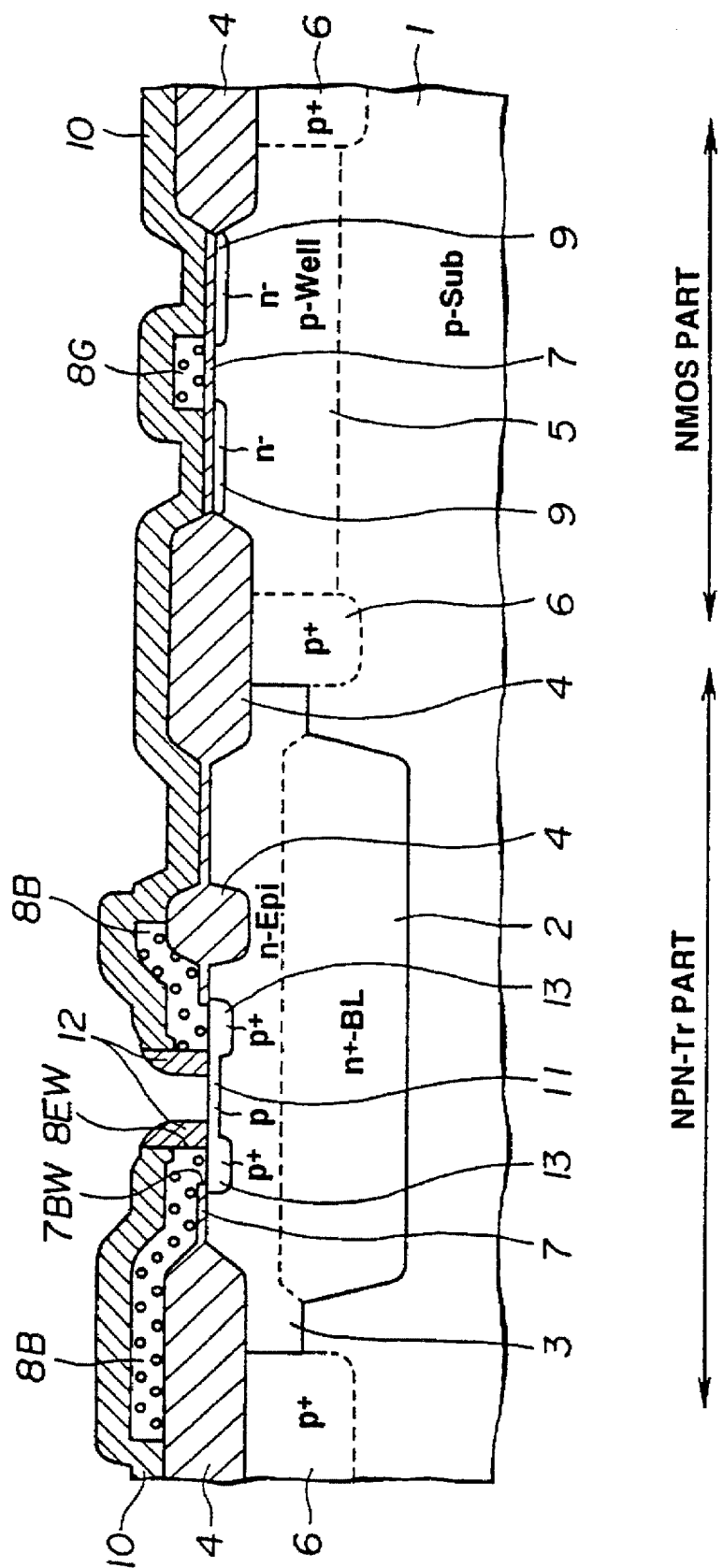
FIG. 9 is a schematic sectional view for showing a state in which a full surface deposition of a SiOx film, formation of graft $\tilde{N}$ base regions with dispersion annealing and formation of emitter side wall through etching-back of SiOx film are carried out.

Then, as raw material gas, TEOS (tetraethoxysilane) was applied to perform a pressure reduced CVD at 740° C. and a SiOx film having a thickness of about 600 nm was formed at the entire surface of the substrate. Subsequently, annealing was carried out at 900° C. for about 20 minutes, boron was dispersed from the base leading electrode 8B into the n-type epitaxial insulator 3 so as to form the graft base region 13 and at the same time boron fed into the real base region 11 was activated. Then, anisotropic etching-back was carried out with $CHF_3/O_2$ mixture gas, for example, so as to form the emitter side wall 12 on the side wall surface of the emitter window 8EW. This emitter side wall 12 may act to insulate the base leading electrode 8B against the emitter leading electrode 14E (see FIG. 11) to be formed later. In FIG. 9 are illustrated steps performed up to now.

Figure 10:
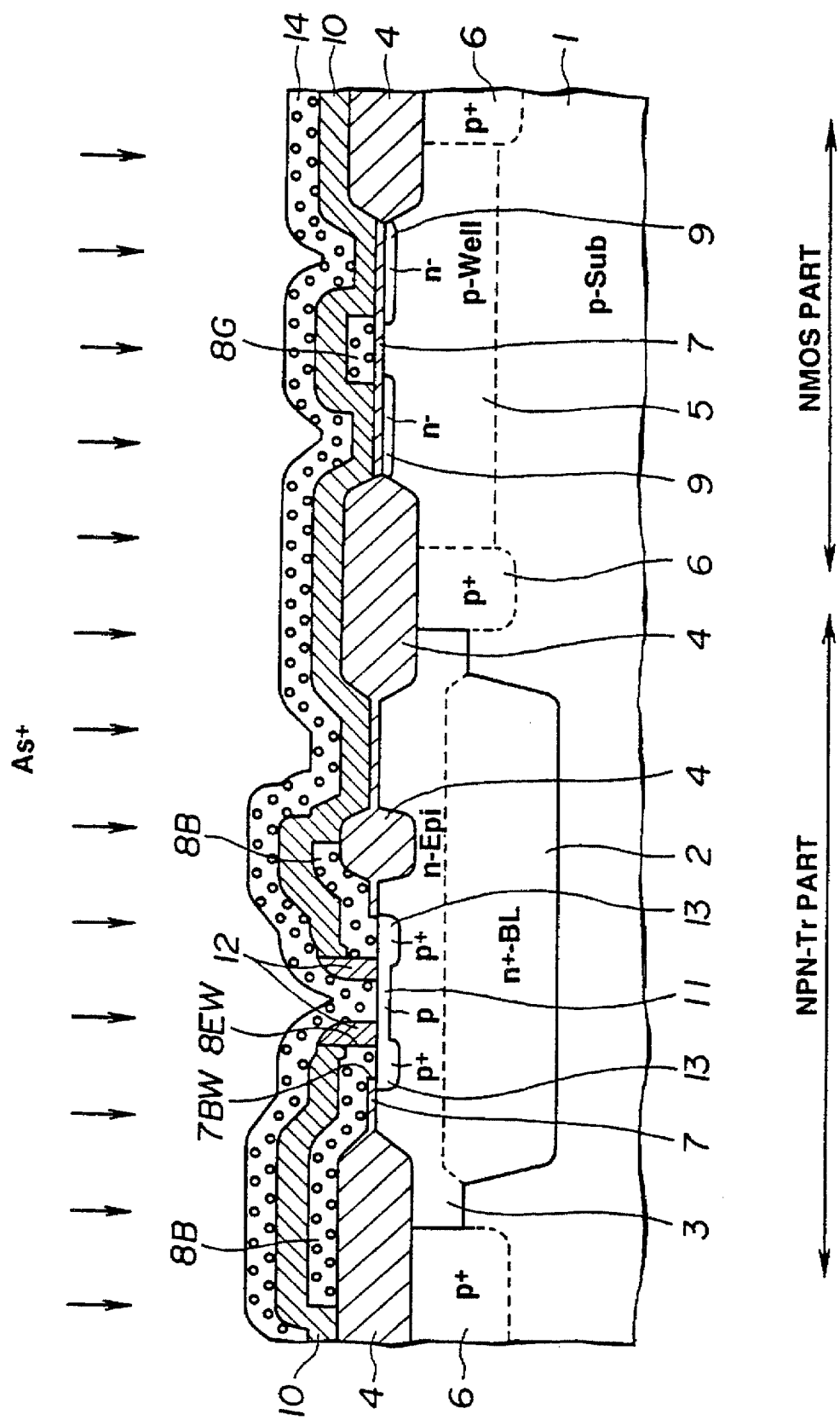
FIG. 10 is a schematic sectional view for showing a state in which a full surface deposition of a second insulator polysilicon film and feeding of emitter impurities are carried out.
Figure 11:
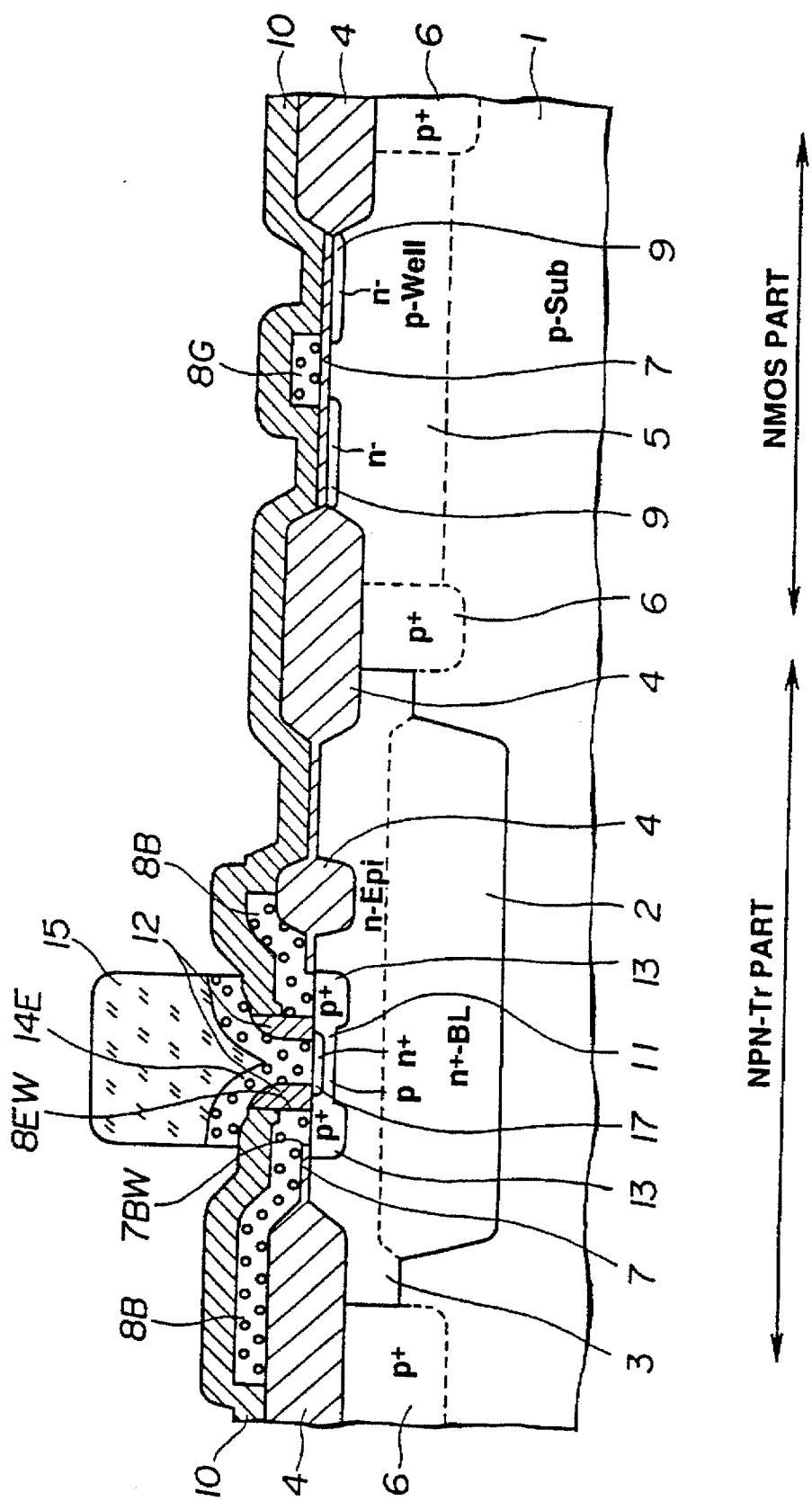
FIG. 11 is a schematic sectional view for showing a state in which formation of an emitter region with dispersion annealing and formation of emitter leading electrode through patterning of a second insulator polysilicon film are carried out.

Then, as shown in FIG. 10, $SiH_4$ was used as raw material gas and a reduced pressure CVD was carried out at 650° C. to form a second insulator polysilicon film 14 having a thickness of about 150 nm at the entire surface of the substrate. Arsenic (As) was ion injected into the second insulator polysilicon film 14 under a condition of ion accelerating energy of 40 keV and a dose of $1\times10^{16}/cm^2$, for example. This arsenic is impurity of emitter. Subsequently, the entire surface of the substrate was covered by the SiOx film not shown and the annealing was carried out, arsenic was dispersed from the aforesaid second insulator polysilicon film 14 into the real base region 11 to form an n-type emitter region 17.

Then, after the SiOx film covering the entire surface of the substrate was removed, the resist mask 15 was formed on the exposed second insulator polysilicon film 14, dry etching was performed with $SF_6/C_2Cl_3F_3$, for example, so as to form the emitter leading electrode 14E.

Figure 12:
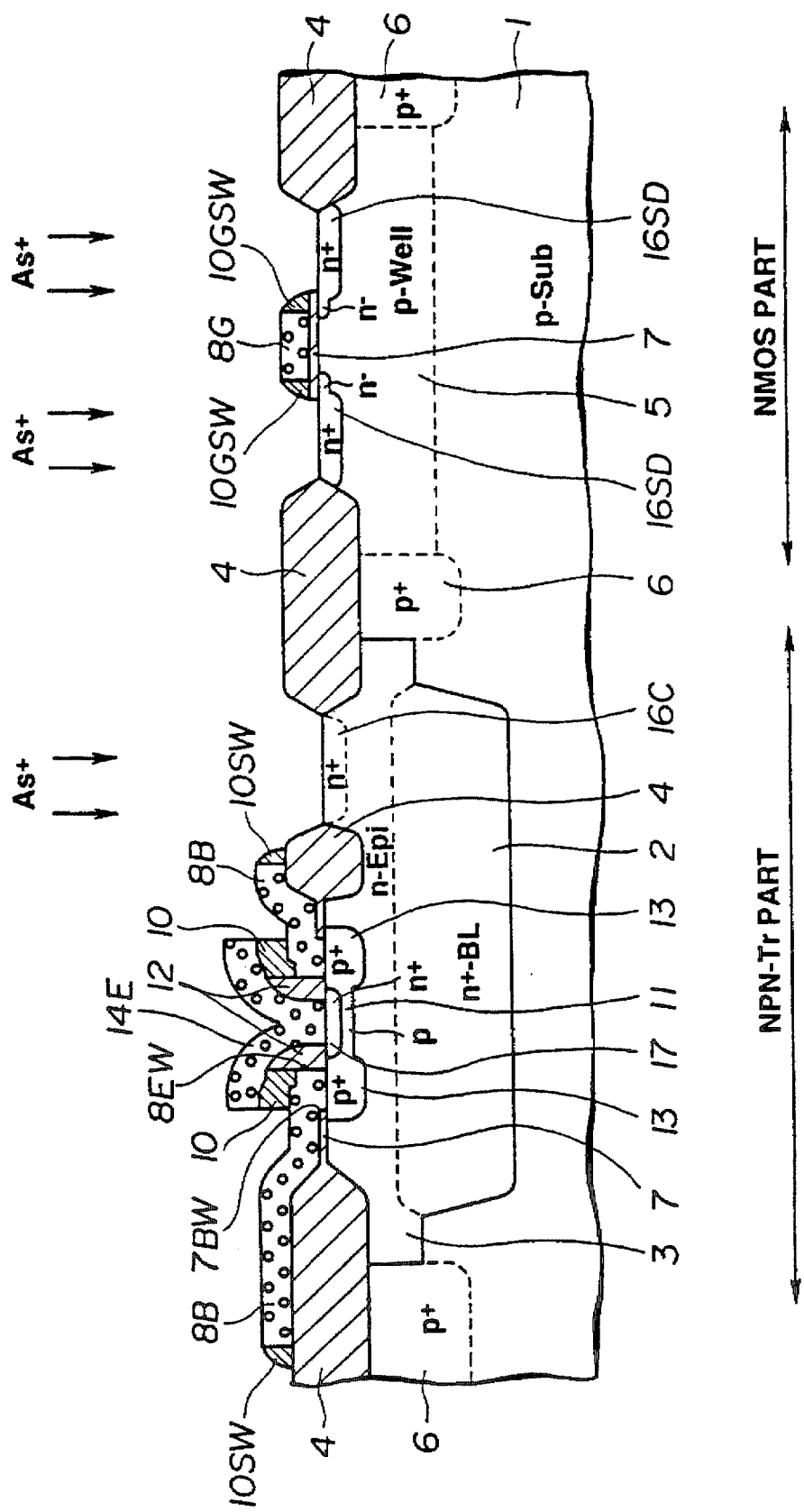
FIG. 12 is a schematic sectional view for showing a state in which formation of a gate side wall under an etching-back of a SiOx film with an emitter leading electrode being applied as a mask and formation of a collector leading region and source/drain regions under feeding of ion of high concentration are carried out.
Figure 13:
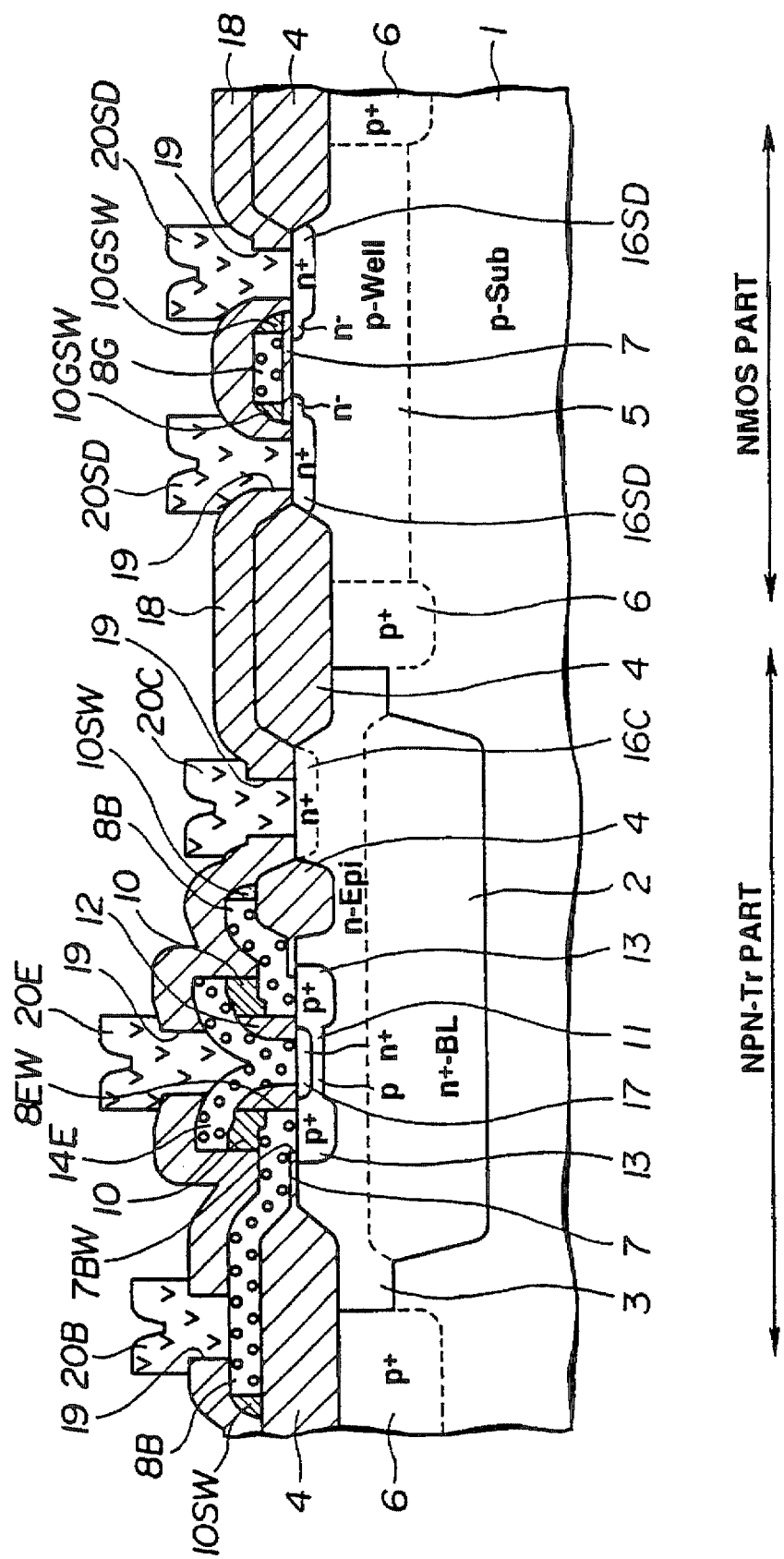
FIG. 13 is a schematic sectional view for showing a state in which a full surface deposition of SiOx interlevel insulator film layer, opening of a connecting hole and formation of an upper insulator wiring are carried out so as to complete BiCMOS.

Then, the SiOx film 10 exposed at this time was etched back with a subsequent use of the aforesaid resist mask 5. As shown in FIG. 12, the SiOx film was left on he base leading electrode 8b and in the region shielded by the emitter leading electrode 10 and at the same time the gate side wall 10GSW was formed on the side wall surface of the gate electrode 8G at NMOS part. At this time, the side wall 10SW was formed also on the side wall surface of the base leading electrode 8B. At this time, the SiOx film 10 on the active region of the substrate is dismissed. This step is the most important step in the present invention.

After this operation, ion injection of arsenic ($As^+$) of high concentration was performed against the collector forming region and NMOS part of NPN-Tr part so as to form a collector leading region 16C and source/drain region 16SD. The ion injecting condition at this time was set to have an ion accelerating energy of 70 keV and a dose of $7\times10^{15}/cm^2$. In FIG. 12 are illustrated the steps performed up to now. Also at PMOS part not shown, boron ($BF_2^+$) was ion injected with a resist mask.

Figure 5:
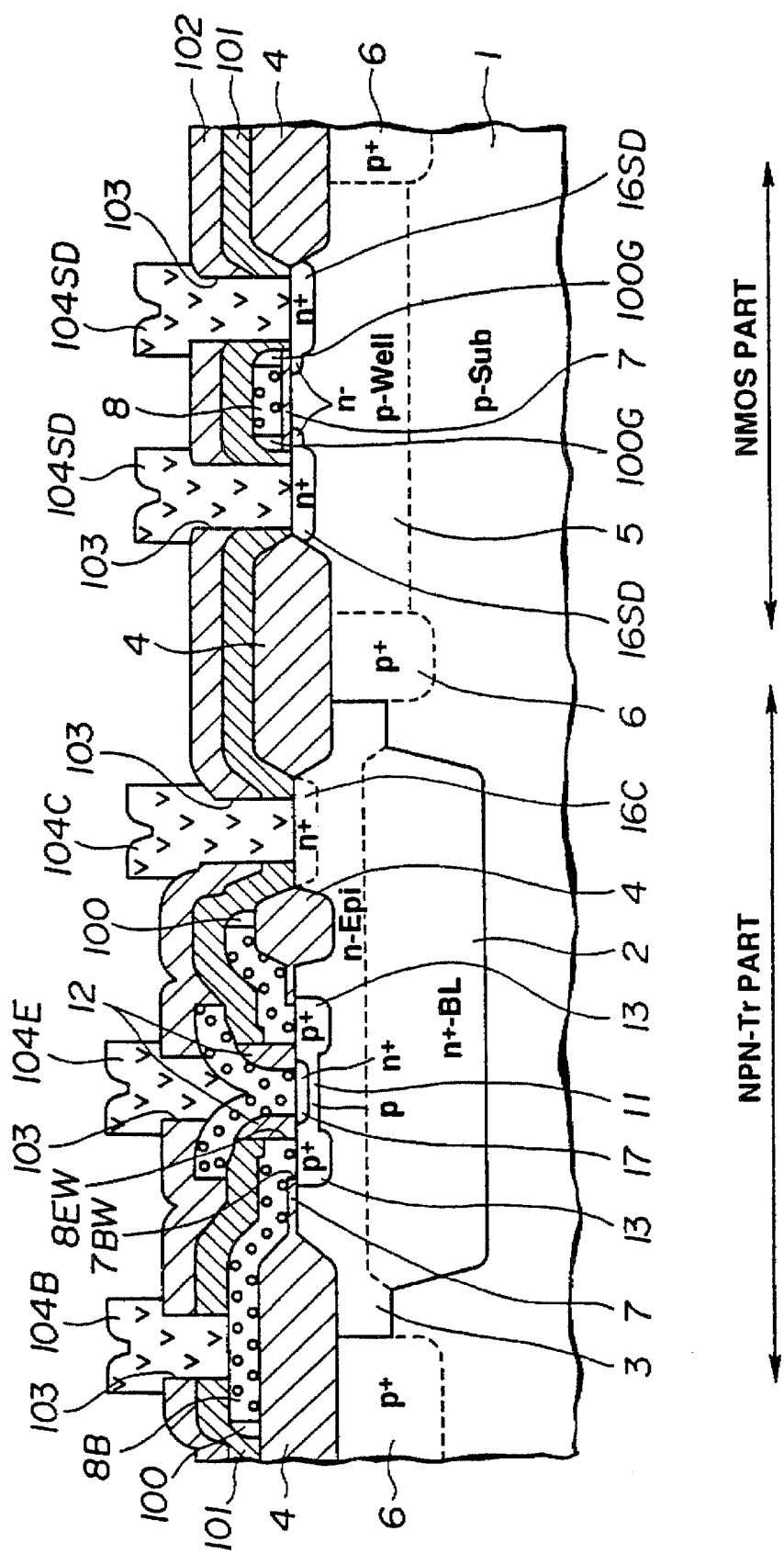
FIG. 5 is a schematic sectional view for showing a state in which opening of a connecting hole and formation of an upper insulator wiring are carried out so as to complete BiCMOS.

Then, a reduced pressure CVD was performed at 400° C. and a SiOx interlevel insulator film layer 18 with a thickness of about 400 nm was formed on the entire surface of the substrate. Under this condition, annealing was carried out at 900° to 1100° C. for about 10 seconds to about 3 minutes so as to activate impurities fed into the source/drain region 16SD. After this operation, the SiOx interlevel insulator film layer 18 was processed with patterning by using a resist mast not shown, and adjacent to each of the base leading electrode 8B, the emitter leading electrode 14E, the collector leading region 16C and source/drain region 16SD, a connecting hole 19 having an opening diameter of 0.8 μm (800 nm) was opened. At this step, differing from the manufacturing process of BiCMOS of the prior art shown in FIG. 5 as described above, since the covered etching insulator on the active region or on the base leading electrode 8B was only one insulator of the SiOx interlevel insulator film layer 18, an aspect ratio of the connecting hole 19 could be restricted to 0.5. In addition, since the depth of the connecting hole 19 was approximately equal at any one of the contacts, excessive over-etching could be eliminated and erosion of the emitter leading electrode 14E could be substantially decreased in particular as compared with that of the prior art.

After this operation, the resist mask was removed, and a laminated insulator wiring film composed of barrier metal and Al–1% Si film was covered by sputtering. At this time, an embedding characteristic and coverage of the laminated wiring into the connecting hole 19 were superior. In addition, the laminated wiring film was processed with patterning to form each of the base electrode 20B, emitter electrode 20E, collector electrode 20C and source/drain electrodes 20SD acting as upper insulator wirings and BiCMOS shown in FIG. 13 was completed.

In BiCMOS completed in the preferred embodiment, the SiOx film 10 having the same source as that of the gate side wall 10GSW of a MOS transistor is removed except a part just below the emitter leading electrode 14E, resulting in that an aspect ratio of the connecting hole 19 for making a contact with the collector leading region 16C or the source/drain region 16SD is restricted low. As a result, a reliability of the upper wiring is improved. In addition, since an over-etching when the connecting hole 19 is opened is reduced, an erosion of the base material insulator at the bottom surface of each of the connecting holes 19 is prevented and an element characteristic set strictly in accordance with a design is accomplished. In addition, since the number of steps is reduced as compared with that of the prior art BiCMOS processing, it is costly effective.

EXAMPLE 2

In this embodiment, a SALICIDE process has been employed in order to reduce a more one insulator contact resistance. At first, referring now to FIGS. 14 to 16, the manufacturing method for BiCMOS will be described. Reference numbers in these figures are partially common with those of the earlier FIG. 6 to FIG. 13, and so detailed explanation of the common parts will be eliminated.

Figure 14:
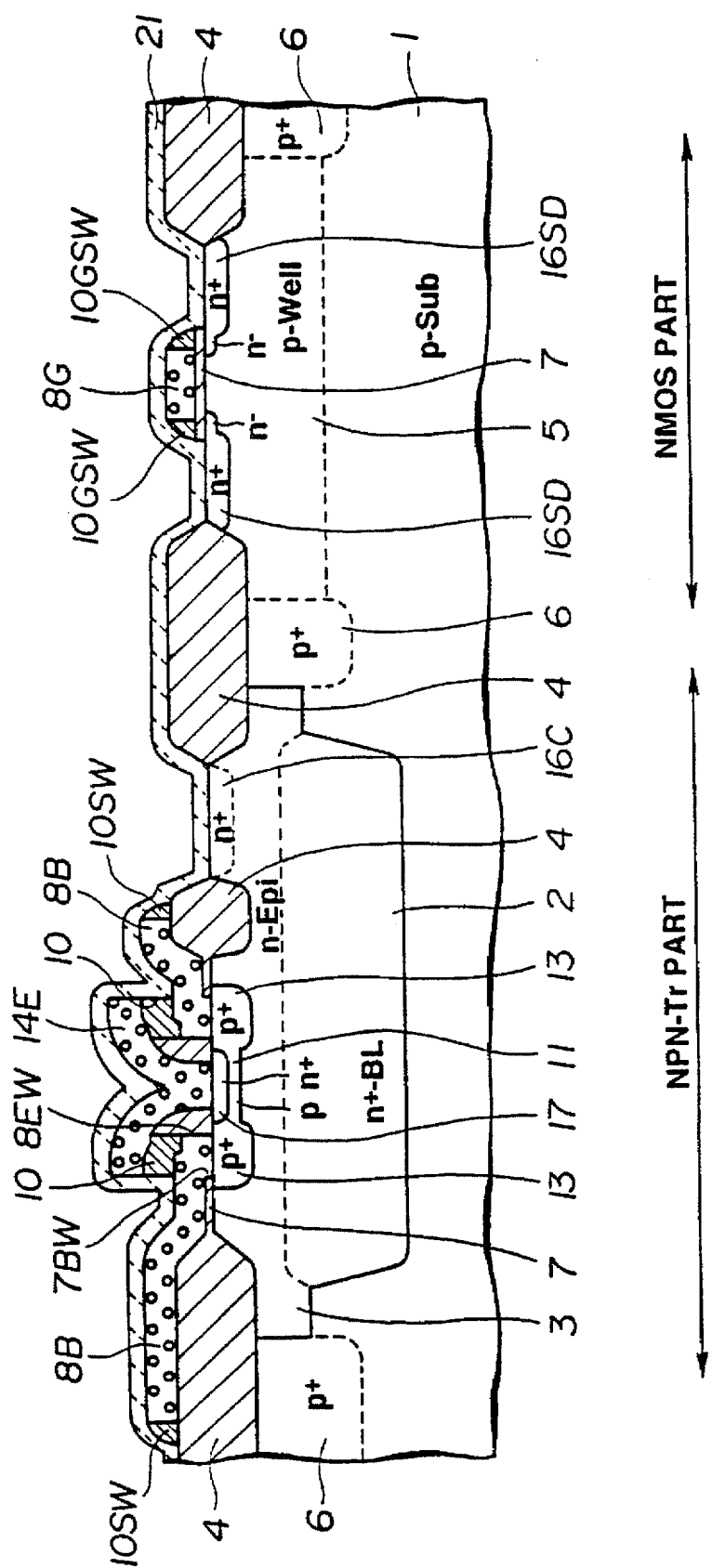
FIG. 14 is a schematic sectional view for showing a state in which upon completion of an etching-back of a SiOx film in a manufacturing process for another BiCMOS to which the present invention is applied, a W film is deposited on the entire surface of the substrate.

At first, after the steps ranging from the etching-back of the SiOx film 10 and formation of the source/drain region 16SD were performed in the same manner as that of the embodiment 1, a W film 21 having a film thickness of about 80 nm was formed on the entire surface of the substrate as the metallic thin film of high melting point as shown in FIG. 14. This film formation was carried out by performing a pressure reduced CVD of about 700° C. using a spattering or mixture gas of $WF_6/H_2$.

Figure 15:
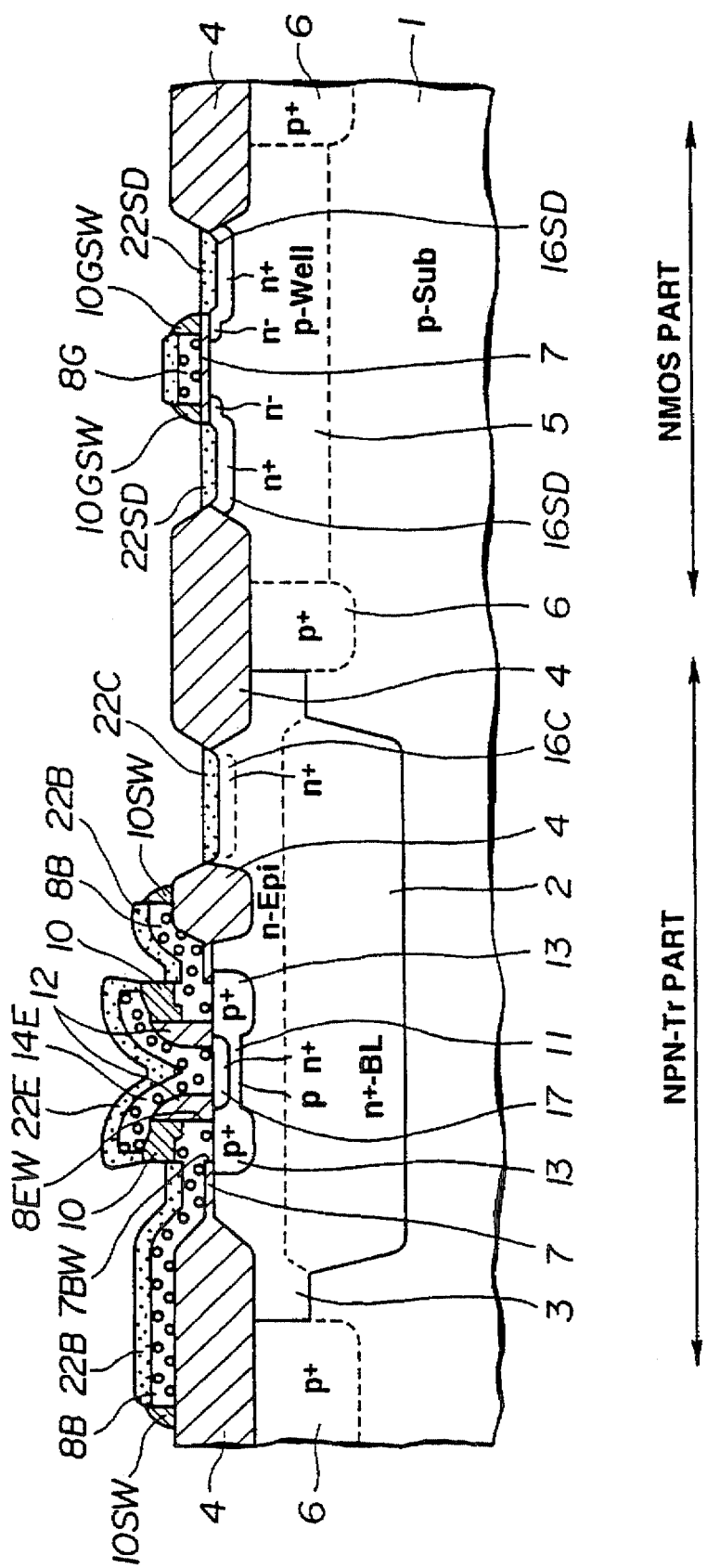
FIG. 15 is a schematic sectional view for showing a state in which a self-aligning silicide formation under annealing is promoted.

Thereafter, the semiconductor device was annealed at a temperature of 700° C. to 800° C. for 10 to 30 minutes to promote a silicidation thereof in an self-aligned manner. As a result, as shown in FIG. 15, WSix layers 22B, 22E, 22C and 22D were formed on a surface portion of the base terminal electrode 8B which was not covered with the side wall 10SW or SiOx 10, an exposed surface of the emitter terminal electrode 14E, the collector terminal electrode 16C, an exposed surface of the gate electrode 8G and source/drain regions 16SD, respectively. Successively, unreacted W film 21 was removed by using an etching solution such as a mixture solution of NH4OH and H2O2.

Figure 16:
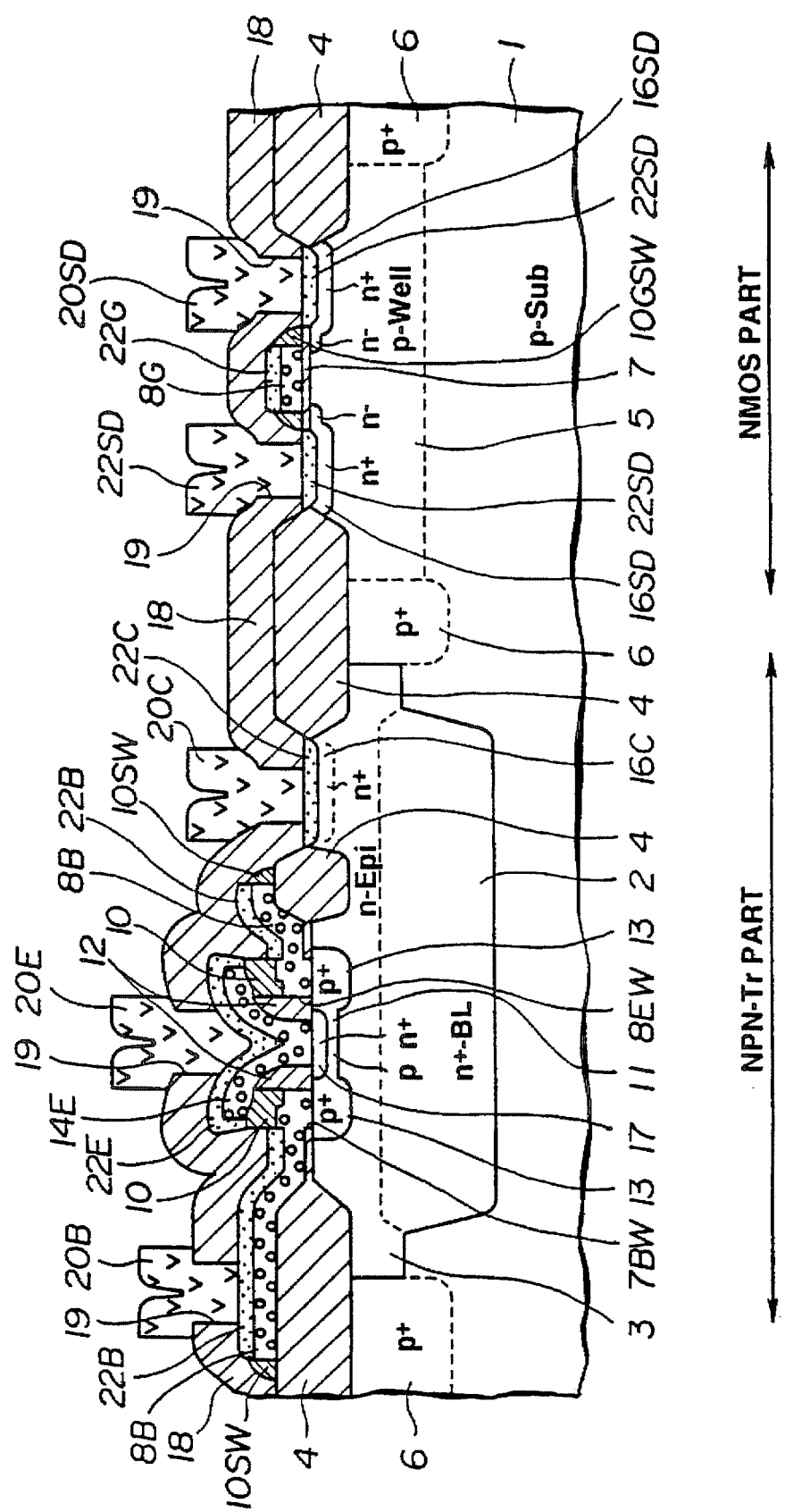
FIG. 16 is a schematic sectional view for showing a state in which a full surface deposition of a SiOx interlevel insulator film layer, opening of a connecting hole and formation of an upper insulator wiring are carried out so as to complete BiCMOS.

The procedures including formation of SiOx interlevel insulator layer film 18, formation of the contact hole 19 and upper layer wiring were repeated in the same manner as described in Example 1 obtain BiCMOS transistor as shown in FIG. 16. The thus-obtained BiCMOS transistor had a contact resistance which was about one-tenth times that of the BiCMOS transistor prepared in Example 1, since the base terminal electrode 8B, the emitter terminal electrode 14 and the gate electrode 8G had a self-aligned polysilicide structure, whereby a high speed action of the semiconductor device can be achieved. Incidentally, although the W layer was used as the refractory metal thin film in this Example, a titanium (Ti) layer can be used instead thereof.

Meanwhile, in the event that the refractory metal polycide film was formed immediately above the impurity-diffusing layer, the impurities in the impurity-diffusing layer was absorbed into the refractory metal polycide film due to a high reactivity of the refractory metal polycide so that a concentration of the impurities in proximity of a boundary surface between the polycide film and the impurity-diffusing layer was lowered. The lowered impurity concentration gives an influence on elemental properties as well known in the art. Especially, a remarkable problem is posed by an absorption of boron (B) from the impurity-diffusing layer by W or Ti. In the structure as shown in FIG. 16, problematical reduction of the p-type impurity concentration is observed at a graft-base region 13. However, a surface layer of the base terminal electrode 8B located immediately above the graft-base region 13 was not silicided due to existence of SiOx film. That is, in the BiCMOS transistor of this Example, a region on which the WSix layer 22B was automatically offset so that the absorption of boron became moderate which was advantageous to the elementary property of the semiconductor device.

EXAMPLE 3

In this Example, the gate side wall of NMOS part was formed at two states in which a length of the LDD region was reduced to achieve a high-speed action of the MOS transistor circuit while solving the short-circuit problem occurring in the SALICIDE process.

Figure 17:
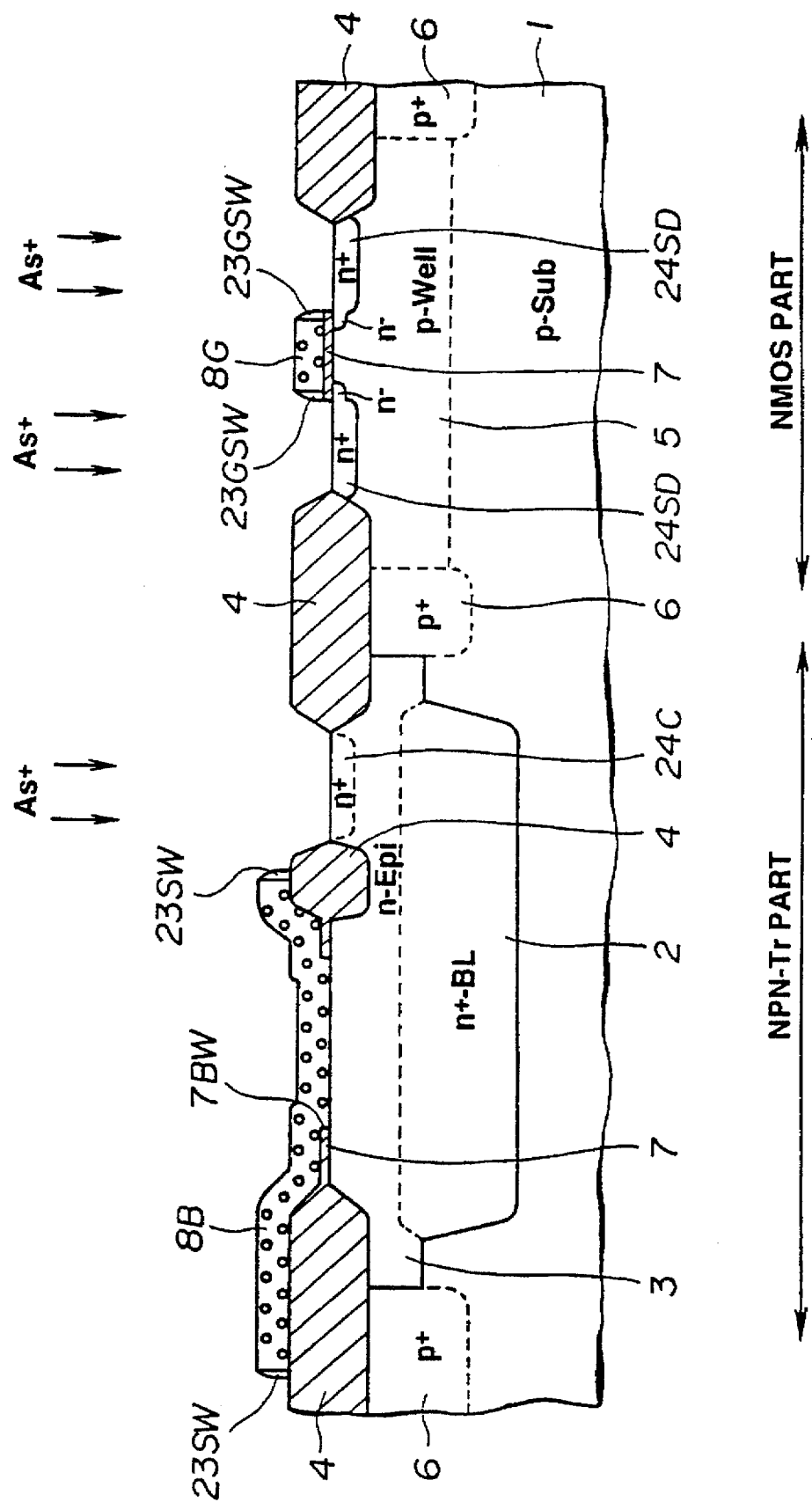
FIG. 17 is a schematic sectional view for showing a state in another manufacturing process for a still further BiCMOS to which the present invention is applied in which a formation of a base leading electrode and a gate electrode, formation of an LDD region under feeding of ion of low concentration, formation of an inner gate side wall through a full deposition of a SiOx film and etching-back, and formation of a collector leading region and source/drain region through feeding of ion of high concentration are carried out.

Generally, in the event that the SALICIDE process is applied to the manufacture of MOS transistors, it is important that the side wall is prevented from being covered with an extended portion of the silicide layer located on the source/drain region thereof so as not to cause a short circuit of the gate electrode. To this end, it is useful to provide the side wall having an increased thickness. However, the increased thickness of the side wall leads to an increased length of the LDD region whereby deterioration mode inherent to the LDD structure is promoted. For example, in the case of the NMOS transistor, the n$^-$ region between the gate end and the n$^+$ region (intermediate LDD region) is large in length. In the LDD-type NMOS transistor, a leading end of the LDD region located immediately below the gate captures electrons so that electrons existing in a region adjacent the leading end is driven away therefrom due to their repulsion force. As a result, a resistance of the intermediate LDD region is increased in an effective manner whereby a current level thereof is deteriorated. Besides, the intermediate LDD region becomes difficult to be controlled by the gate electrode as compared with the LDD region located immediately below the gate. This results in maintaining the increased resistance after the channel inversion. In order to prevent the deterioration mode inherent to the LDD structure, it is desired that the intermediate LDD region is shortened. As a consequence, it is undesired that the thickness of the gate side wall is increased. In this Example, in order to meet such requirements which conflict with each other, the formation of the gate side wall is carried out by a two-stage process. In the following, a manufacturing method of BICMOS transistor according to the present invention is described in detail by referring to FIGS. 17 through 21. Incidentally, in these figures, like parts are indicated by like reference numerals appearing in FIGS. 6 to 13 and therefore detailed explanation therefor is omitted here. In this Example, the NMOS part was formed earlier than the NPN-Tr part. That is, the procedures from the simultaneous formation of the base terminal electrode 8B and the gate electrode 8G to the formation of $n^+$ type LDD region 9 by the low-concentration ion-implantation (refer to FIG. 7) were repeated in the same manner as described in Example 1. Thereafter, the semiconductor device was subjected to a low-pressure CVD method at a temperature of 400° C. so that a SiOx film layer (first insulating film layer) having about 200 nm was deposited on an entire surface of the substrate. Successively, the SiOx film layer was subjected to an etch-back process so that a thin inner gate side wall 23GSW having a width of 0.15 μm was formed on a side surface of the gate electrode 80. Thereafter, the contact terminal region of the NPN-Tr part and the NMOS part were subjected to a high-concentration ion-implantation method. As a result, As$^+$ ions were introduced into these parts so that a contact terminal region 24C and source/drain regions 24SD were formed. The semiconductor device subjected to a manufacturing process up to the steps described above is illustrated in FIG. 17.

Figure 18:
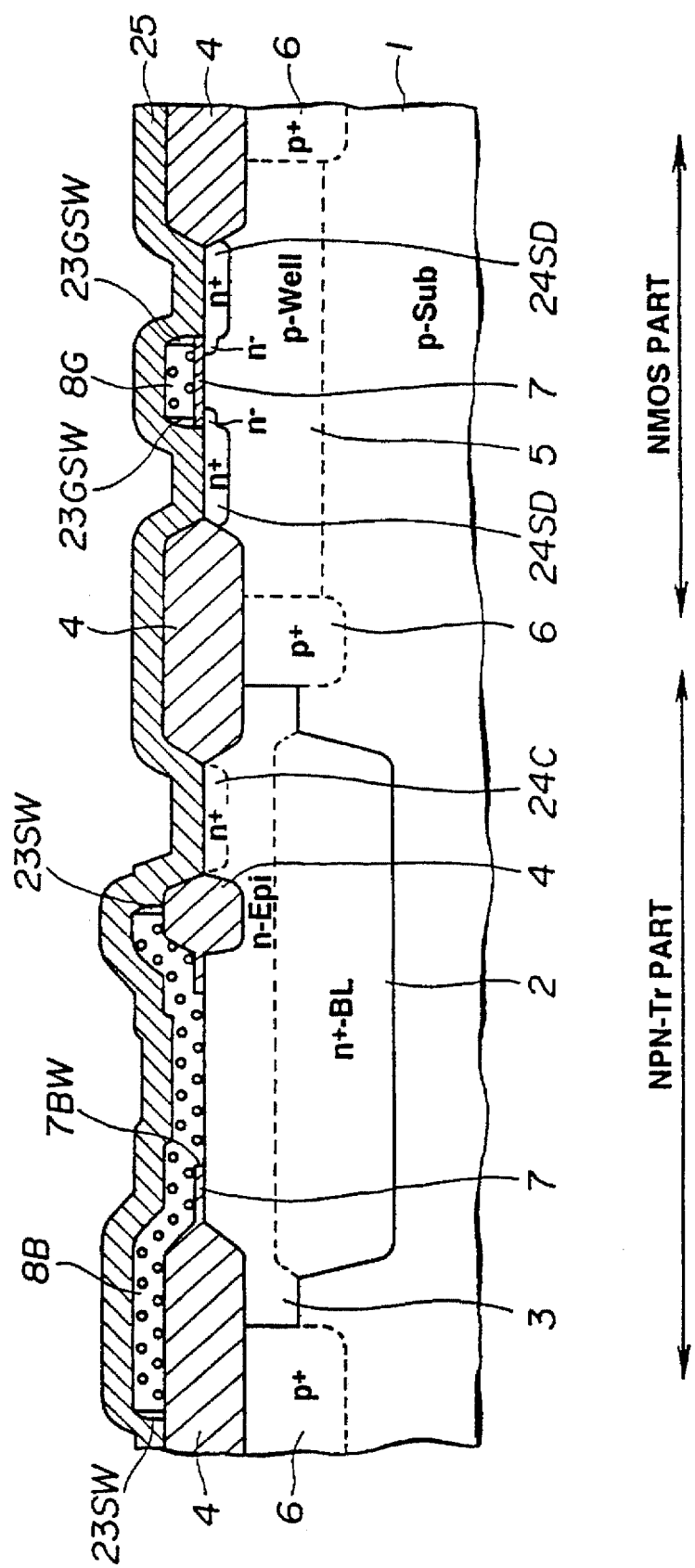
FIG. 18 is a schematic sectional view for showing a state in which a SiOx film is deposited on an entire surface.
Figure 19:
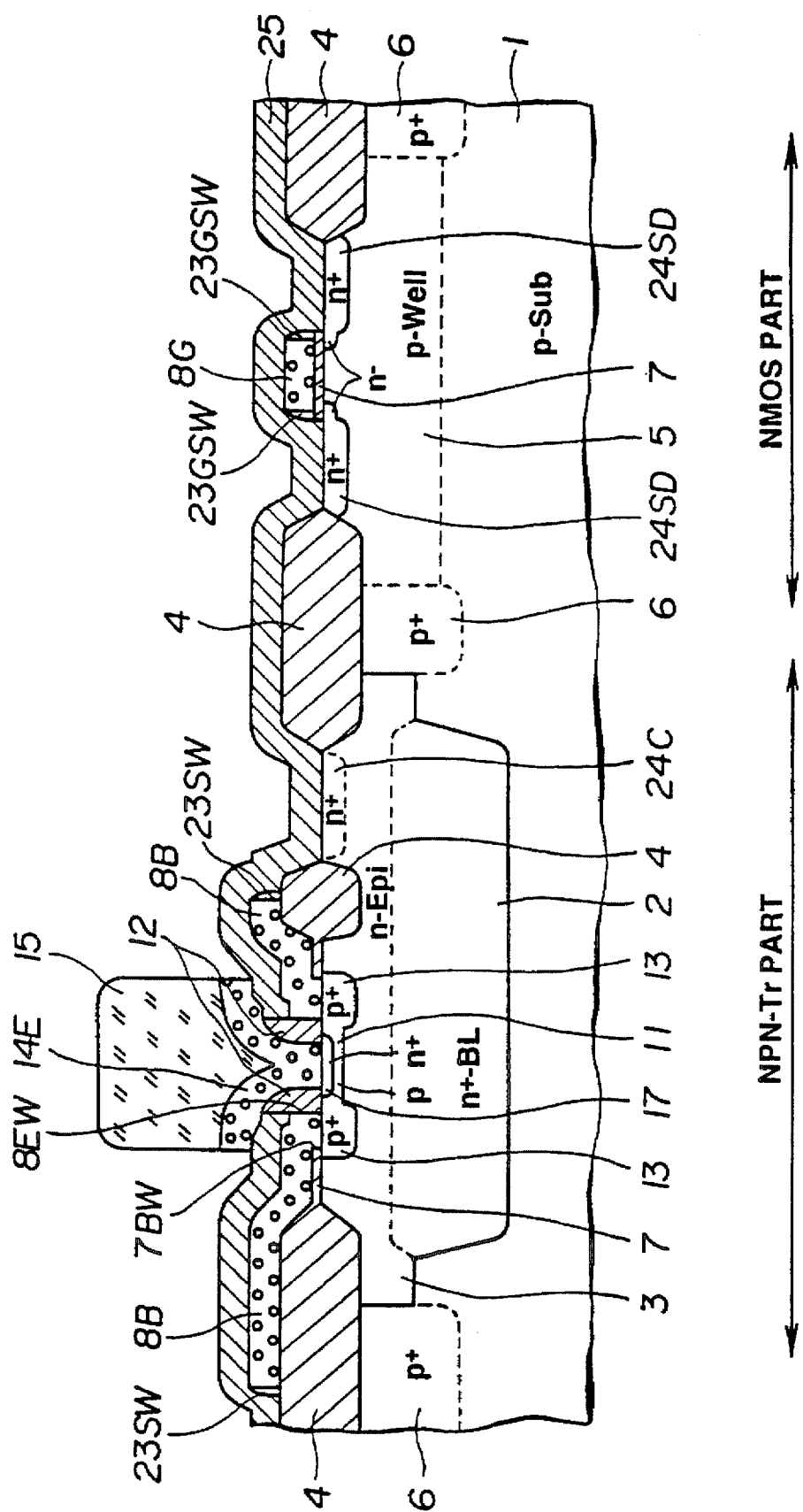
FIG. 19 is a schematic sectional view for showing a state in which opening of an emitter window, formation of a real base region, a full surface deposition of SiOx film, formation of a graft base region through a dispersion annealing, formation of an emitter side wall through an emitter etching-back of a SiOx film, a full surface deposition of a second insulator polysilicon film, formation of an emitter region through a dispersion annealing and formation of an emitter leading electrode through a patterning of a second insulator polysilicon film are carried out.

Next, the semiconductor device was further subjected to a low-pressure CVD method so that SiOx film layer (as a second insulating layer) having a thickness of about 300 nm was formed as shown in FIG. 18.

Successively, the following procedures of Example 1 were repeated in the same manner as described above. The procedures included formation of an emitter window 8EW, formation of intrinsic base region 11 by an ion-implantation method, deposition of an emitter side wall insulating layer on an entire surface of the substrate, formation of a graft-base region 13 by diffusion-annealing, formation of an emitter side wall 12 by etch-back of the emitter side wall insulating layer, deposition of a second polysilicon film layer on the entire surface of the substrate, formation of the emitter region by diffusion-annealing, and formation of an emitter terminal electrode 14E by patterning of the second polysilicon film layer 14 in which a resist mask 15 was used. Incidentally, when the graft-base region 13 was formed, the source/drain regions 24SD of the NMOS part and the source/drain regions of the PMOS part (not shown) were simultaneously activated. Thus, since the source/drain regions were activated in advance, the diffusion-annealing was applied only to the formation of the emitter region 17 so that the time required for the diffusion annealing was able to be reduced to minimum, whereby a shallow junction could be realized. The semiconductor device subjected to a manufacturing process up to the steps described above is illustrated in FIG. 19.

Figure 20:
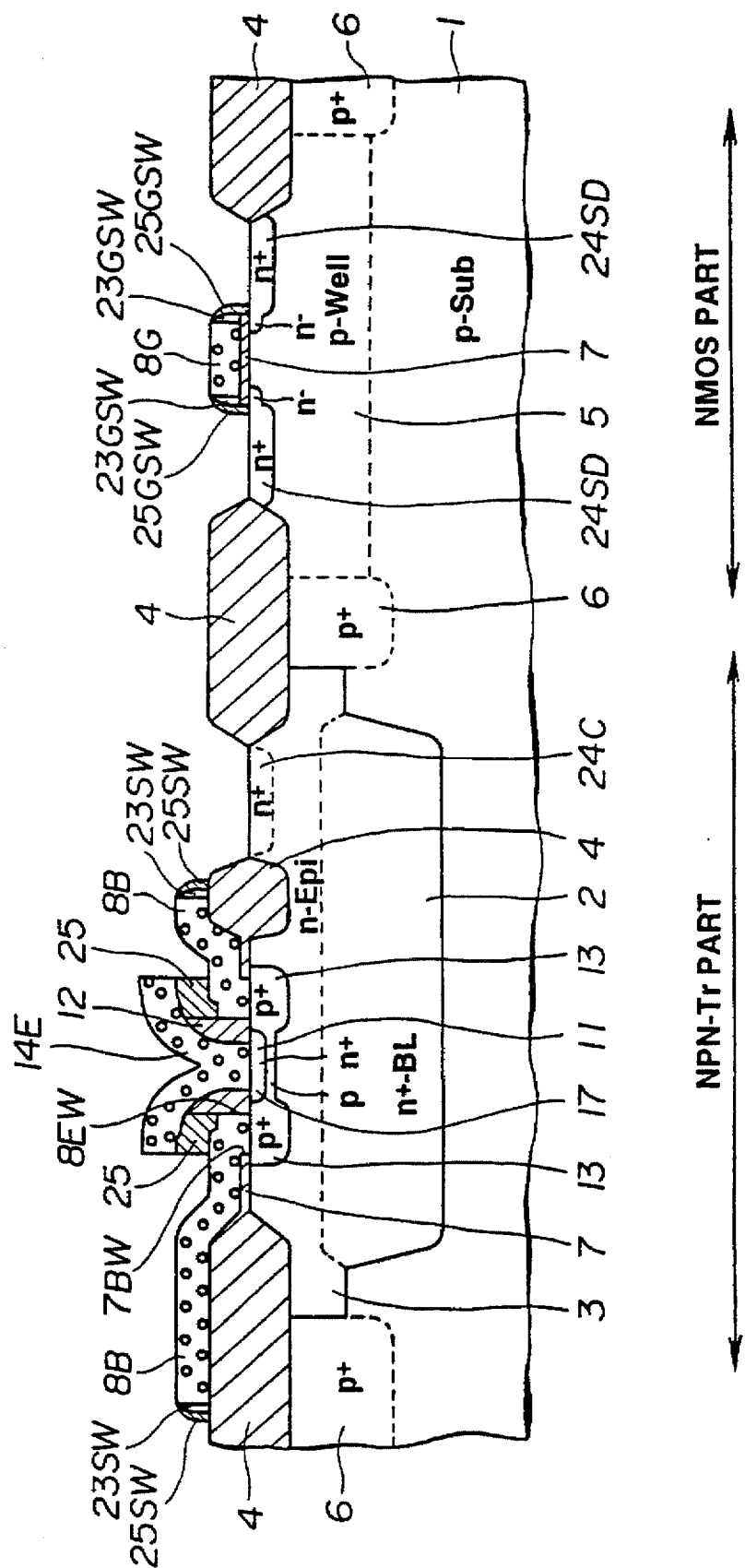
FIG. 20 is a schematic sectional view for showing a state in which a full surface deposition of a SiOx film and a formation of an outer gate side wall through etching-back are carried out.

Next, as shown in FIG. 20, the SiOx film 25 was subjected to an etch-back process so that an outer gate side wall layer 25GSW was laminated on the inner gate side wall layer 23GSW formed on the gate electrode 8G. As a result, a total of the inner and outer side wall layers on the gate electrode 8G was 0.3 μm. At this time, a side wall 25SW was formed on a side surface of the base terminal electrode 8B in an overlapped relation to the side wall 23SW.

Figure 21:
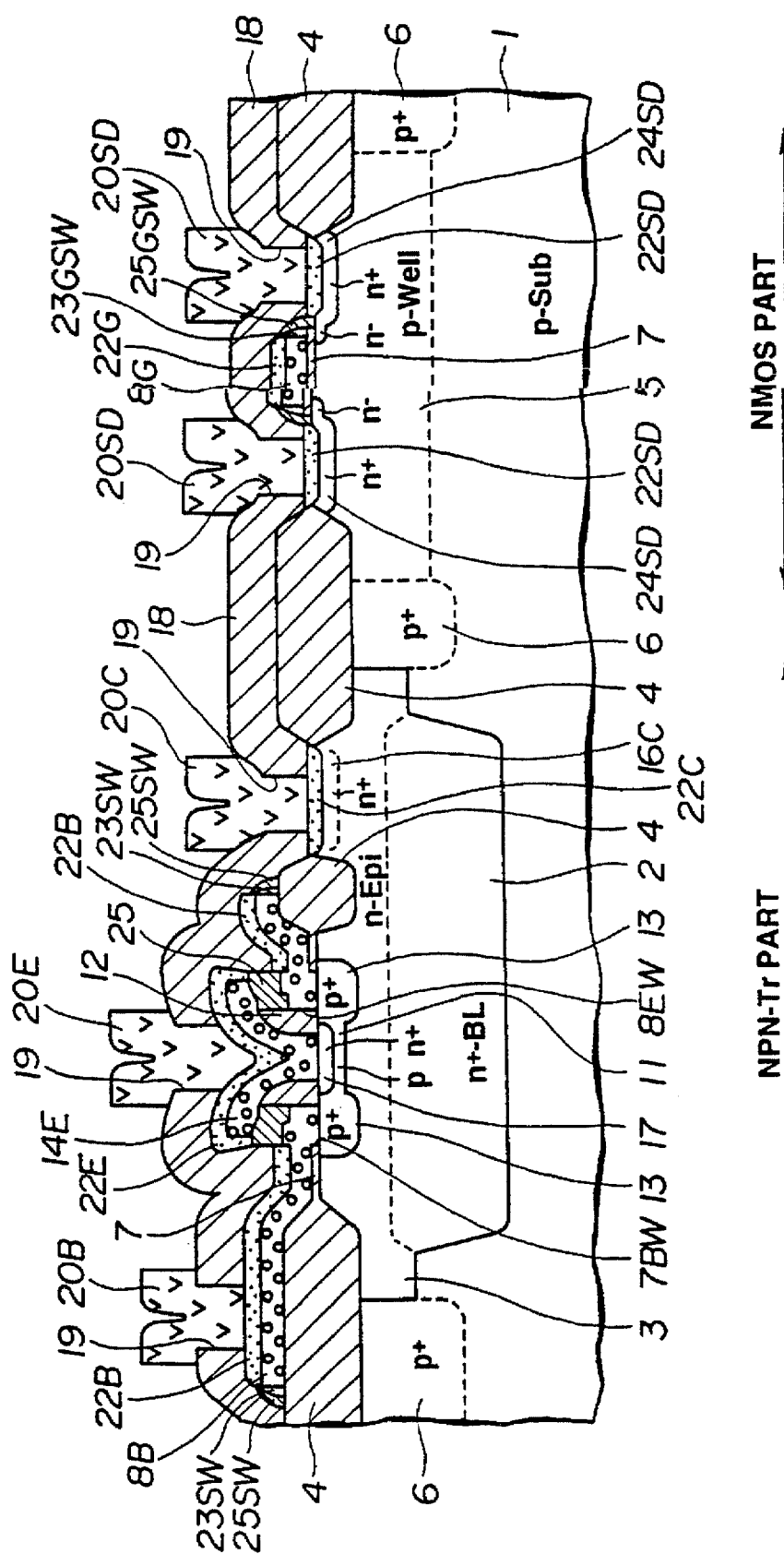
FIG. 21 is a schematic sectional view for showing a state in which a full surface deposition of a SiOx interlevel insulator film layer, opening of a connecting hole and a formation of an upper insulator wiring are carried out so as to complete BiCMOS.

Further, the following procedures of Example 2 were repeated in the same manner as described above. The procedures included the deposition of W film 21, the self-aligning silicidation (SALICIDE) by annealing, the deposition of SiOx interlevel insulator film layer 18, formation of the contact hole 19, the upper wiring (for the base electrode 20B, the emitter electrode 20E, the collector electrode 20C, the source/drain electrodes 20SD). As a result, the BiMOS transistor as shown in FIG. 21 was finished.

In the thus-finished BiMOS transistor, a length of the $n^-$-type LDD region was restricted by the thin inner gate side wall 23GSW so that a resistance of the LDD region was reduced whereby an action speed of the semiconductor device was improved. In addition, since the gate side wall of the CMOS transistor circuit had a sufficiently large width, the short circuit between the source/drain regions 24SD and the gate electrode 8G was effectively prevented even though the SALICIDE process was applied to the manufacture of the semiconductor device.

Although the present invention is explained by way of the above three examples, the present invention is not intended to be limited thereto. As will be apparently understood, further modifications and changes can be made with respect to dimensions of the respective parts of the BiMOS transistor, conditions of the film formation, conditions of the etching process, conditions of the ion-implantation process, and materials for the insulating layers, the refractory metal thin film and laminated wiring films.

As described above, in accordance with the present invention, the BiCMOS transistor can be manufactured, while reducing its manufacturing steps, with a high reliability at a low cost as compared with those manufactured by the conventional processes. Alternatively, if the number of the manufacturing steps is kept unchanged from the conventional manufacturing process, the present invention enables the manufacture of the BiCMOS transistor having a further improved property.

What is claimed is:

1. A method of manufacturing a BiCMOS semiconductor device comprising a substrate, a vertical bipolar transistor and an LDD (lightly doped drain)-type MOS transistor, the latter two being both provided on said substrate, said method comprising the steps of:

(1) forming a first semiconductor film on said substrate and subjecting said first semiconductor film to a patterning to form a first conductive base terminal electrode of said vertical bipolar transistor and a gate electrode of said LDD-type MOS transistor;

(2) subjecting said substrate to low-concentration ion-implantation in which said gate electrode is used as a mask to form an LDD region of said LDD-type MOS transistor;

(3) covering an entire surface of said substrate with an insulating layer;

(4) forming an emitter window to expose said substrate by subjecting each of said insulating layer and said base terminal electrode to a patterning simultaneously;

(5) forming an insulating emitter side wall on an inner side surface of said emitter window;

(6) depositing a second semiconductor film on an entire surface of said substrate;

(7) subjecting said second semiconductor film to a patterning to form a second conductive emitter terminal electrode;

(8) subjecting said insulating layer to an etch back process by using said emitter terminal electrode as a mask to expose at least an upper surface of said gate electrode, a portion of said base terminal electrode and an active region of said substrate and form a gate side wall on a side surface of said gate electrode; and (9) subjecting said substrate to a high-concentration ion-implantation in which said gate electrode and said gate side wall are used as a mask to form drain/source regions of said LDD-type MOS transistor.

2. The method according to claim 1, wherein a collector terminal region of said vertical bipolar transistor is simultaneously formed by the high-concentration ion-implantation of step (9).

3. The method according to claim 1, wherein said substrate is a silicon substrate, said first and second semiconductor films are both comprised of a silicon thin film containing impurities, and, after the step 8, the entire surface of said substrate is covered with a high refractory metal thin film which is then subjected to a thermal treatment whereby said refractory metal thin film is converted to a refractory metal silicide layer which is provided in a self-aligned manner on surfaces of said gate electrode, a portion of said base terminal electrode, said emitter terminal electrode, and an active region of said substrate.

4. A method of manufacturing a BiCMOS semiconductor device comprising a substrate, a vertical bipolar transistor and an LDD (lightly doped drain)-type MOS transistor, the latter two being both provided on said substrate, said method comprising the steps of:

(1) forming a first semiconductor film on said substrate and subjecting said first semiconductor film to a patterning to form a first conductive base terminal electrode of said vertical bipolar transistor and a gate electrode of said LDD-type MOS transistor;

(2) subjecting said substrate to a low-concentration ion-implantation in which said gate electrode is used as a mask, to form an LDD region of said LDD-type MOS transistor;

(3) covering an entire surface of said substrate with a first insulating layer;

(4) etching back said first insulating layer to form an inner gate side wall layer on a side surface of said gate electrode;

(5) subjecting said substrate to a high-concentration ion-implantation in which said gate electrode and said inner gate side wall layer are used as a mask to form drain/source regions of said LDD-type MOS transistor;

(6) covering the entire surface of said substrate with a second insulating layer;

(7) forming an emitter window to expose said substrate by subjecting said second insulating layer and said base terminal electrode to a patterning simultaneously;

(8) forming an insulating emitter side wall on an inner wall surface of said emitter window;

(9) depositing a second semiconductor film on the entire surface of said substrate;

(10) subjecting said second semiconductor film to a patterning to form a second conductive emitter terminal electrode; and

(11) etching back said second insulating layer by using said emitter terminal electrode as a mask to expose at least an upper surface of said gate electrode, a portion of said base terminal electrode and an active region of said substrate and form an outer gate side wall layer on a surface of said inner gate side wall layer.

5. The method according to claim 4, wherein a collector terminal region of said vertical bipolar transistor is simultaneously formed by the high-concentration ion-implantation of step (5).

6. The method according to claim 4, wherein said substrate is a silicon substrate, said first and second semiconductor films are both comprised of a silicon thin film containing impurities, and, after the step (11), the entire surface of said substrate is covered with a refractory metal thin film, which is then subjected to a thermal treatment whereby said refractory metal thin film is converted to a refractory metal silicide layer provided in a self-aligned manner on surfaces of said gate electrode, a portion of said base terminal electrode, said emitter terminal electrode and an active region of said substrate.

\* \* \* \* \*